(12) United States Patent
Zhang et al.

(10) Patent No.: US 12,400,982 B2
(45) Date of Patent: Aug. 26, 2025

(54) CHIP PACKAGE ON PACKAGE STRUCTURE, PACKAGING METHOD THEREOF, AND ELECTRONIC DEVICE

(71) Applicant: Huawei Technologies Co., Ltd., Shenzhen (CN)

(72) Inventors: Tonglong Zhang, Shenzhen (CN); Xiaodong Zhang, Shenzhen (CN); Yong Guan, Shanghai (CN); Simin Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 539 days.

(21) Appl. No.: 17/733,132

(22) Filed: Apr. 29, 2022

(65) Prior Publication Data
US 2022/0262751 A1 Aug. 18, 2022

Related U.S. Application Data

(63) Continuation of application No. PCT/CN2019/114506, filed on Oct. 30, 2019.

(51) Int. Cl.
*H01L 23/00* (2006.01)
*H01L 25/10* (2006.01)

(52) U.S. Cl.
CPC ............. *H01L 24/08* (2013.01); *H01L 24/09* (2013.01); *H01L 24/80* (2013.01); *H01L 24/81* (2013.01);
(Continued)

(58) Field of Classification Search
CPC ....... H01L 23/488; H01L 24/05; H01L 24/08; H01L 24/09; H01L 24/16; H01L 24/17;
(Continued)

(56) References Cited

U.S. PATENT DOCUMENTS

2014/0035162 A1* 2/2014 Khan ................ H01L 23/49816
257/774
2014/0103488 A1 4/2014 Chen et al.
(Continued)

FOREIGN PATENT DOCUMENTS

CN 103915421 A 7/2014
CN 104505382 A 4/2015
(Continued)

OTHER PUBLICATIONS

Zhang, C., et al., "Thermo-structural model of stacked field-programmable gate arrays with through-silicon vias", Electronics Letters, vol. 45(24), pp. 1236-1238 (Year: 2009).*

*Primary Examiner* — Fernando L Toledo
*Assistant Examiner* — Ryan T. Fortin
(74) *Attorney, Agent, or Firm* — Conley Rose, P.C.

(57) ABSTRACT

A chip package on package structure includes a primary chip stack unit having pins insulated and spaced from each other on a first surface; a first bonding layer disposed on the first surface, where the first bonding layer includes bonding components insulated and spaced from each other, each bonding component includes a bonding part, and any two bonding parts are insulated and have a same cross-sectional area, and the bonding components are separately bonded to the pins; and secondary chip stack units, disposed on a surface of a side that is of the first bonding layer and that is away from the primary chip stack unit, where the secondary chip stack unit has micro bumps insulated and spaced from each other, and each of the micro bumps is bonded to one of the bonding components.

20 Claims, 22 Drawing Sheets

(52) U.S. Cl.
CPC ............ *H01L 25/105* (2013.01); *H01L 24/05* (2013.01); *H01L 24/16* (2013.01); *H01L 24/17* (2013.01); *H01L 24/32* (2013.01); *H01L 24/33* (2013.01); *H01L 24/73* (2013.01); *H01L 24/96* (2013.01); *H01L 24/97* (2013.01); *H01L 2224/05647* (2013.01); *H01L 2224/0801* (2013.01); *H01L 2224/08057* (2013.01); *H01L 2224/08148* (2013.01); *H01L 2224/0903* (2013.01); *H01L 2224/09051* (2013.01); *H01L 2224/16145* (2013.01); *H01L 2224/1703* (2013.01); *H01L 2224/17051* (2013.01); *H01L 2224/32145* (2013.01); *H01L 2224/3303* (2013.01); *H01L 2224/33051* (2013.01); *H01L 2224/73204* (2013.01); *H01L 2224/80203* (2013.01); *H01L 2224/80805* (2013.01); *H01L 2224/80895* (2013.01); *H01L 2224/80896* (2013.01); *H01L 2224/81203* (2013.01); *H01L 2224/81805* (2013.01); *H01L 2224/81815* (2013.01); *H01L 2225/1023* (2013.01); *H01L 2225/1041* (2013.01); *H01L 2225/107* (2013.01); *H01L 2225/1094* (2013.01)

(58) Field of Classification Search
CPC ......... H01L 24/19; H01L 24/32; H01L 24/33; H01L 24/73; H01L 24/80; H01L 24/81; H01L 24/96; H01L 24/97; H01L 25/105; H01L 25/03; H01L 25/0652; H01L 25/50; H01L 25/0655; H01L 2224/05647; H01L 2224/0801; H01L 2224/08057; H01L 2224/08148; H01L 2224/0903; H01L 2224/09051; H01L 2224/16145; H01L 2224/1703; H01L 2224/17051; H01L 2224/32145; H01L 2224/3303; H01L 2224/33051; H01L 2224/73204; H01L 2224/80203; H01L 2224/80805; H01L 2224/80895; H01L 2224/80896; H01L 2224/81203; H01L 2224/81805; H01L 2224/81815; H01L 2225/1023; H01L 2225/1041; H01L 2225/107; H01L 2225/1094

See application file for complete search history.

(56) References Cited

U.S. PATENT DOCUMENTS

| | | | |
|---|---|---|---|
| 2014/0185264 A1 | 7/2014 | Chen et al. | |
| 2014/0312490 A1* | 10/2014 | Yang | H01L 25/03 257/737 |
| 2015/0214192 A1* | 7/2015 | Lin | H01L 23/49816 257/737 |
| 2016/0329262 A1* | 11/2016 | Hsiao | H01L 23/49894 |
| 2018/0076179 A1* | 3/2018 | Hsu | H01L 21/56 |
| 2019/0244905 A1* | 8/2019 | Yu | H01L 23/5383 |
| 2020/0091128 A1* | 3/2020 | Elsherbini | H01L 23/5386 |

FOREIGN PATENT DOCUMENTS

| | | | | |
|---|---|---|---|---|
| CN | 107785339 A | | 3/2018 | |
| KR | 10-2015-0084287 | * | 7/2015 | ............ H01L 23/28 |

* cited by examiner

CHIP PACKAGE ON PACKAGE STRUCTURE, PACKAGING METHOD THEREOF, AND ELECTRONIC DEVICE

CROSS-REFERENCE TO RELATED APPLICATIONS

This is a continuation of International Patent Application No. PCT/CN2019/114506 filed on Oct. 30, 2019, the disclosure of which is hereby incorporated by reference in its entirety.

TECHNICAL FIELD

This application relates to the field of electronic technologies, and in particular, to a chip package on package structure, a packaging method thereof, and an electronic device.

BACKGROUND

With development of electronic technologies, electronic devices continuously develop toward miniaturization, integration, and ultra-thinness, and a chip package on package structure in the electronic device also has to develop toward miniaturization.

Package on package (POP) becomes a development trend of the chip package on package structure to allow for miniaturization and integration of the chip package on package structure. Package on package is a structure in which a plurality of secondary chip stack units are bonded to a primary chip stack unit in a same chip package on package structure. However, reliability of bonding the primary chip stack unit and the secondary chip stack unit directly affects performance of the chip package on package structure, and thus becomes a key research topic for persons skilled in the art.

An example in which a plurality of secondary chip stack units whose pin spacings differ greatly are bonded to a primary chip stack unit is used. A chip package on package structure includes four chip stack units, and a first secondary chip stack unit, a second secondary chip stack unit, and a third secondary chip stack unit are bonded to the primary chip stack unit. A pin spacing of the first secondary chip stack unit is less than 1 (micrometer) a pin spacing of the second secondary chip stack unit is 5 and a pin spacing of the third secondary chip stack unit is 40 µm.

Because requirements on a process vary with different pin spacings of chips, different bonding methods are used. A bonding method with a high integration degree needs to be used for a chip having a small pin spacing, and a bonding method with a low integration degree needs to be used for a chip having a large pin spacing. Therefore, how to reliably bond a plurality of secondary chip stack units to a same primary chip stack unit becomes a technical problem to be resolved by the persons skilled in the art.

SUMMARY

Embodiments of this application provide a chip package on package structure, a packaging method thereof, and an electronic device, to resolve how to reliably bond a plurality of secondary chip stack units to a same primary chip stack unit.

To achieve the foregoing objectives, the following technical solutions are used in embodiments.

According to a first aspect, a chip package on package structure is provided, including: a primary chip stack unit, having a first surface and a plurality of primary pins insulated and spaced from each other on the first surface; a first bonding layer disposed on the first surface, where the first bonding layer includes a plurality of bonding components insulated and spaced from each other; each of the plurality of bonding components includes at least one bonding part, and any two bonding parts in the plurality of bonding components are insulated and have a same cross-sectional area; and the plurality of bonding components are bonded to the plurality of primary pins respectively, and each of the plurality of primary pins is bonded to at least one bonding part in a bonding component bonded to the primary pin; and a plurality of secondary chip stack units, disposed on a surface that is of the first bonding layer and that is away from the primary chip stack unit, where the secondary chip stack unit has a plurality of micro bumps insulated and spaced from each other, and each of the plurality of micro bumps is bonded to one of the plurality of bonding components, and is bonded to at least one bonding part in a bonding component bonded to the micro bump. In embodiments of this application, the micro bump and the primary pin are bonded by using the bonding component, to separately bond the plurality of secondary chip stack units to the primary chip stack unit. In addition, because any two bonding parts in the first bonding layer have an equal cross-sectional area, when the bonding parts in the first bonding layer are manufactured by using a same process, surfaces of the manufactured bonding parts are planes of similar roughness. In this way, regardless of whether cross-sectional areas of the micro bumps of the plurality of secondary chip stack units are equal, because the surface of the bonding part in contact with the micro bump is a plane, the bonding part may be in close contact with the micro bump. Therefore, the bonding part can be reliably bonded to the micro bump regardless of which bonding process is used. This ensures electrical performance and reliability of the primary chip stack unit and the plurality of secondary chip stack units after bonding.

Optionally, the at least one bonding part is a plurality of bonding parts, and spacings between adjacent bonding parts in a same bonding component in the plurality of bonding components are equal. When the first bonding layer is manufactured by using a chemical-mechanical planarization (CMP) process, a balance between chemical corrosion and mechanical grinding in the CMP process is required, to obtain bonding parts having similar surface flatness. However, when the spacings between adjacent bonding parts are different, surfaces in contact with a polishing liquid have different degrees of chemical corrosion, and the bonding parts obtained through mechanical grinding have different surface flatness. This may affect bonding reliability.

Optionally, cross-sectional areas of the plurality of micro bumps of each secondary chip stack unit in the plurality of secondary chip stack units are not completely equal. The cross-sectional area of the bonding part in the plurality of bonding components is equal to a cross-sectional area of a micro bump having a smallest cross-sectional area. In this case, the bonding part is in a one-to-one correspondence with the micro bump having the smallest cross-sectional area. This ensures reliable bonding of the bonding part and the micro bump. In addition, the bonding part does not need to be excessively small. In this way, a requirement on the manufacturing process of the bonding part can be lowered.

Optionally, a plurality of micro bumps included in each of the plurality of secondary chip stack units have an equal cross-sectional area. This can simplify the process and facilitate manufacturing.

Optionally, a spacing between adjacent micro bumps of a secondary chip stack unit whose micro bump has the smallest cross-sectional area in the plurality of secondary chip stack units is equal to the spacing between adjacent bonding parts in the bonding component. In this way, when a bonding requirement is met, a density of the bonding parts does not need to be large, and the requirement on the manufacturing process is lowered as much as possible. This can reduce manufacturing costs.

Optionally, the chip package on package structure further includes a second bonding layer, and the second bonding layer is disposed between the primary chip stack unit and the first bonding layer. The second bonding layer includes a plurality of auxiliary pins insulated and spaced from each other. Two ends of each of the plurality of auxiliary pins are bonded to each of the plurality of primary pins and each of the plurality of bonding components respectively, and each of the plurality of auxiliary pins is bonded to at least one bonding part in a bonding component bonded to the auxiliary pin. Auxiliary pins are directly bonded to some primary chip stack units sold in the existing markets. This structure may also be applicable to a solution in which the secondary chip stack unit is bonded by using the bonding component in the present disclosure. This can expand an application scope of the chip package on package structure.

Optionally, an auxiliary pin and a micro bump bonded by using a same bonding component in the plurality of bonding components have an equal cross-sectional area. A large cross-sectional area of the auxiliary pin may increase a bonding possibility of adjacent auxiliary pins. A small cross-sectional area of the auxiliary pin may affect a bonding effect of the bonding component and the auxiliary pin, and affect signal transmission on the primary pin.

Optionally, in the plurality of bonding components, a quantity of bonding parts in a bonding component bonded to a micro bump having a large cross-sectional area is greater than a quantity of bonding parts in a bonding component bonded to a micro bump having a small cross-sectional area. In other words, different quantities of bonding parts are disposed based on micro bumps of different sizes, to improve a bonding effect of the bonding component and the micro bump.

Optionally, any two bonding parts in the plurality of bonding components have a same material. When a same manufacturing process is used, the same material of the bonding parts indicates similar surface roughness of manufactured bonding parts. In addition, a plurality of bonding parts can be manufactured by using the same process, and the process is simple and efficient.

Optionally, any two bonding parts in the plurality of bonding components have cross sections of a same shape. The bonding parts have cross sections of the same shape, and the bonding parts during manufacturing have a similar process error. This can improve similarity of surface roughness of the plurality of bonding parts. In addition, this can lower a requirement on a mask plate, simplify the manufacturing process, and reduces costs.

Optionally, bonding components bonded to a same secondary chip stack unit in the plurality of secondary chip stack units include an equal quantity of bonding parts. In this way, whether each bonding component is bonded to a pin corresponding to the bonding component does not need to be separately considered, which simplifies design and improves efficiency.

Optionally, the plurality of secondary chip stack units include a first secondary chip stack unit, a second secondary chip stack unit, and a third secondary chip stack unit. A micro bump of the first secondary chip stack unit is a copper stud. A micro bump of the second secondary chip stack unit includes a low-temperature solder layer and a high-temperature solder layer bonded to each other, and the low-temperature solder layer is disposed close to the first bonding layer relative to the high-temperature solder layer. A micro bump of the third secondary chip stack unit is a solder ball.

Optionally, the primary chip stack unit includes a primary die, and the primary die has a plurality of first through silicon vias passing through the primary die. An active surface of the primary die is used as the first surface. The plurality of first through silicon vias are bonded to the plurality of primary pins respectively. Because a secondary chip stack unit bonded to the primary chip stack unit is connected to an external signal through the first through silicon via on the primary die, an electrical connection structure does not need to be disposed outside the primary chip stack unit. Therefore, a chip package on package structure of this structure has a small size.

Optionally, the primary chip stack unit includes: a primary die; a first redistribution layer, disposed on the active surface of the primary die and bonded to the primary die; a second redistribution layer, disposed on a non-active surface of the primary die, where a surface that is of the second redistribution layer and that is away from the primary die is used as the first surface; and a first molding layer, disposed between the first redistribution layer and the second redistribution layer and located on a periphery of the primary die, where the first molding layer has a plurality of first through molding vias passing through the first molding layer, and two ends of the plurality of each of first through molding vias are bonded to the first redistribution layer and the second redistribution layer respectively. Because a secondary chip stack unit bonded to the primary chip stack unit is connected to an external signal through the first through molding via disposed on the periphery of the primary die, the primary die does not need to be punched. This can lower the process requirement and reduce costs.

Optionally, the chip package on package structure further includes a second molding layer covering all of the plurality of secondary chip stack units on a side away from the primary chip stack unit. In a direction perpendicular to the primary chip stack unit, a surface of a larger secondary chip stack unit in the plurality of secondary chip stack units is aligned with a surface that is of the second molding layer and that is away from the primary chip stack unit. The second molding layer exposes the surface of the larger secondary chip stack unit in the plurality of secondary chip stack units, so that heat generated by the second molding layer can be dissipated, to improve a heat dissipating effect.

Optionally, the chip package on package structure further includes: a substrate, an underfill layer located between the primary chip stack unit and the substrate and covering the plurality of secondary chip stack units, and a plurality of through dielectric vias embedded in the underfill layer. Two ends of each of the plurality of through dielectric vias are bonded to the substrate and each of the plurality of bonding components respectively. The through dielectric via is directly bonded to the substrate without disposing a redistribution layer to lead out signals. This simplifies the process and makes the chip package on package structure light and thin.

Optionally, the chip package on package structure further includes: a third molding layer, covering the plurality of secondary chip stack units, where the third molding layer has a plurality of second through molding vias passing through the third molding layer, and a first end of each of the plurality of second through molding vias is bonded to the bonding part; and a third redistribution layer, disposed on a side that is of the third molding layer and that is away from the primary chip stack unit, where the third redistribution layer is bonded to a second end of each of the plurality of second through molding vias; and a substrate, disposed on a side that is of the third redistribution layer and that is away from the primary chip stack unit, and bonded to the third redistribution layer. The redistribution layer is disposed to lead out electrical signals and is bonded to the substrate. This can increase a quantity of pins and increase a signal transmission amount on the chip package on package structure.

Optionally, the primary chip stack unit includes a primary die, where an active surface of the primary die is used as the first surface. The chip package on package structure further includes: a heat dissipating lid, having a groove, where the heat dissipating lid and the substrate are jointed, the groove and the substrate form a receptacle, and the primary chip stack unit and the plurality of secondary chip stack units are located in the receptacle; and a thermally conductive adhesive, located between the primary chip stack unit and the heat dissipating lid, and configured to bond the primary chip stack unit and the heat dissipating lid. The heat dissipating lid is disposed to improve a heat dissipating effect of the chip package on package structure.

Optionally, each of the plurality of secondary chip stack units includes a plurality of stacked secondary dies, adjacent secondary dies are bonded, and a secondary die closest to the first bonding layer is bonded to the first bonding layer. The secondary chip stack unit may be a chip of a plurality of structures.

According to a second aspect, a packaging method of a chip package on package structure is provided, and includes: A first bonding layer is manufactured in each assembly region of a primary wafer. The primary wafer includes a plurality of assembly regions defined by horizontal and vertical scribe lines. A first surface of the primary wafer has a plurality of primary pins insulated and spaced from each other in each assembly region. The first bonding layer includes a plurality of bonding components insulated and spaced from each other. Each of the plurality of bonding components includes at least one bonding part, and any two bonding parts in the plurality of bonding components are insulated and have a same cross-sectional area. The plurality of bonding components are bonded to the plurality of primary pins respectively, and each of the plurality of primary pins is bonded to at least one bonding part in a bonding component bonded to the primary pin. A plurality of secondary chip stack units are bonded to the first bonding layer. At least two secondary chip stack units are bonded to each assembly region. Each of the plurality of secondary chip stack units has a plurality of micro bumps insulated and spaced from each other. Each of the plurality of micro bumps is bonded to one of the plurality of bonding components, and is bonded to at least one bonding part in a bonding component bonded to the micro bump. Separation is performed along the scribe lines to obtain a plurality of chip package on package structures.

Optionally, the manufacturing a first bonding layer in each assembly region of a primary wafer includes: A plurality of bonding studs having an equal cross-sectional area and spaced from each other are formed on the first surface of the primary wafer. Each of the plurality of primary pins is bonded to at least one of the plurality of bonding studs. An insulation film is deposited on the first surface on which the plurality of bonding studs are formed. The insulation film covers the plurality of bonding studs. Chemical-mechanical planarization processing is performed on the insulation film and the plurality of bonding studs, and a plurality of bonding parts and a first insulation layer sleeved on the bonding parts are formed, to obtain the first bonding layer. Bonding parts bonded to a same primary pin are used as one bonding component.

Optionally, the bonding a plurality of secondary chip stack units to the first bonding layer includes: The plurality of secondary chip stack units are sorted in a descending order of bonding temperatures of the micro bumps of the plurality of secondary chip stack units. The secondary chip stack units are sequentially bonded to the first bonding layer.

Optionally, before the manufacturing a first bonding layer in each assembly region of a primary wafer, the packaging method of the chip package on package structure further includes: A second bonding layer is manufactured in each assembly region of the primary wafer. The second bonding layer includes a plurality of auxiliary pins insulated and spaced from each other, and the plurality of auxiliary pins are bonded to the plurality of primary pins respectively.

According to a third aspect, an electronic device is provided, and includes a circuit board and the chip package on package structure according to any one of the first aspect. The chip package on package structure is bonded to the circuit board.

Figure 1:
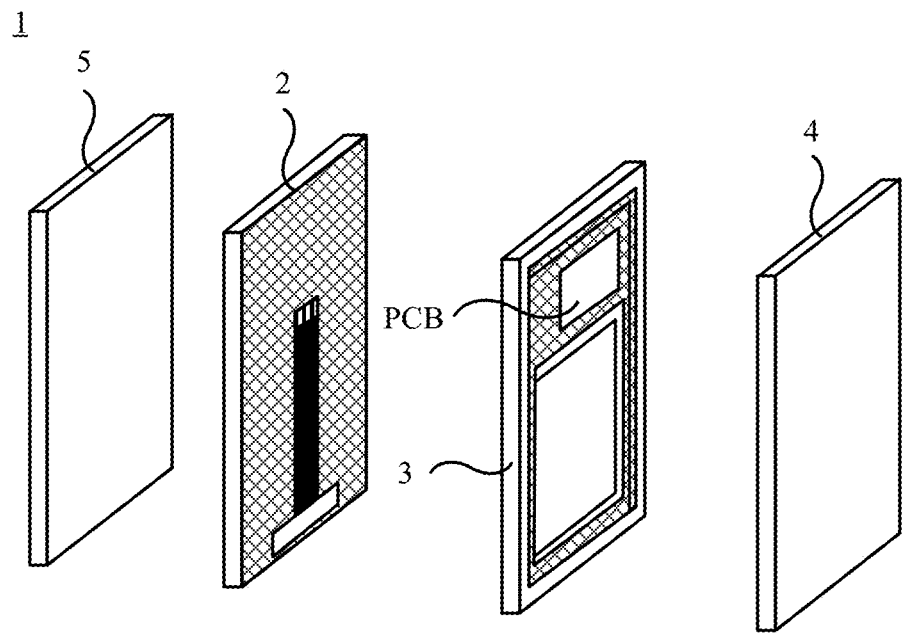
FIG. 1 is a schematic diagram of a structure of an electronic device according to an embodiment of this application.

Reference numerals: 1 electronic device, 2 display module, 3 middle frame, 4 housing, 5 cover, 100 chip package on package structure, 10 primary chip stack unit, 101 primary wafer, 11 primary pin, 12 primary die, 13 first through silicon via, 14 first redistribution layer, 15 second redistribution layer, 16 first molding layer, 161 first through molding via, 20 first bonding layer, 21 bonding component, 211 bonding part, 212 bonding stud, 22 first insulation layer, 30 secondary chip stack unit, 31 micro bump, 32 first secondary chip stack unit, 33 second secondary chip stack unit, 34 third secondary chip stack unit, 35 secondary die, 40 second bonding layer, 41 auxiliary solder pad, 50 second molding layer, 60 substrate, 70 underfill layer, 80 through dielectric via, 90 heat dissipating lid, 95 thermally conductive adhesive, 96 third molding layer, 961 second through molding via, and 97 third redistribution layer.

DESCRIPTION OF EMBODIMENTS

Unless otherwise defined, a technical term or a scientific term used in this application should have a general meaning understood by persons skilled in the art. In the specification and claims of this application, the terms "first", "second", "third", and the like are not intended to indicate any order, quantity, or significance, but are intended to distinguish between different components. Therefore, a feature limited by "first", "second", or "third" may explicitly or implicitly include one or more features. In the descriptions of embodiments of this application, unless otherwise specified, "a plurality of" means two or more than two.

Orientation terms such as "left", "right", "up", and "down" are defined relative to an orientation at which the components are schematically placed in the accompanying drawings. It should be understood that these orientation terms are relative concepts. These orientation terms are used for corresponding description and clarification, and may vary with the orientation at which the components are placed.

An embodiment of this application provides an electronic device. The electronic device may be a terminal device having a display interface, such as a mobile phone, a television, a display, a tablet, or a vehicle-mounted computer, or may be an intelligent display wearable device such as a smartwatch or a smart band, or may be a communication device such as a server, a memory, or a base station, or may be a smart automobile, or the like. A specific form of the electronic device is not particularly limited in embodiments of this application. For ease of description, an example in which the electronic device is a mobile phone is used for description in the following embodiments.

In this case, as shown in FIG. 1, an electronic device 1 mainly includes a display module 2, a middle frame 3, a housing (or referred to as a battery cover or a rear housing) 4, and a cover 5.

The display module 2 is provided with a light emitting side capable of showing a displayed image and a rear side opposite to the light emitting side. The rear side of the display module 2 is close to the middle frame 3, and the cover 5 is disposed on the light emitting side of the display module 2.

The display module 2 includes a display panel (DP).

In a possible embodiment of this application, the display module 2 is a liquid crystal display module. In this case, the display panel is a liquid-crystal display (LCD). Based on this, the display module 2 further includes a backlight module (BLU) located on a back surface of the liquid crystal display (away from a surface of a side that is of the LCD and that is used to display an image).

The backlight module may provide a light source for the liquid crystal display, so that each sub pixel in the liquid crystal display can emit light to display an image.

Alternatively, in another possible embodiment of this application, the display module 2 is an organic light emitting diode display module. In this case, the display panel is an organic light-emitting diode (OLED) display. Because an electroluminescence layer is disposed in each sub pixel in the OLED display, the OLED display may implement self-luminescence after receiving a working voltage. In this case, the backlight module does not need to be disposed in the display module 2 having the OLED display.

The cover 5 is located on a side that is of the display module 2 and that is away from the middle frame 3. The cover 5, for example, may be cover glass (CG), and the cover glass may have special toughness.

The middle frame 3 is located between the display module 2 and the housing 4. A surface that is of the middle frame 3 and that is away from the display module 2 is used to install internal elements such as a battery, a printed circuit board (PCB), a camera, and an antenna. After the housing 4 covers the middle frame 3, the internal elements are located between the housing 4 and the middle frame 3.

The electronic device 1 further includes electronic components such as a mainboard, a system on chip (SOC), and a chip package on package structure that are disposed on the PCB. The PCB is configured to carry the electronic components, and complete signal interaction with the electronic components.

To meet a trend of miniaturization, integration, ultra-thinness, and diversified functions of electronic devices, a chip package on package structure gradually develops towards miniaturization and integration.

Figure 2A:
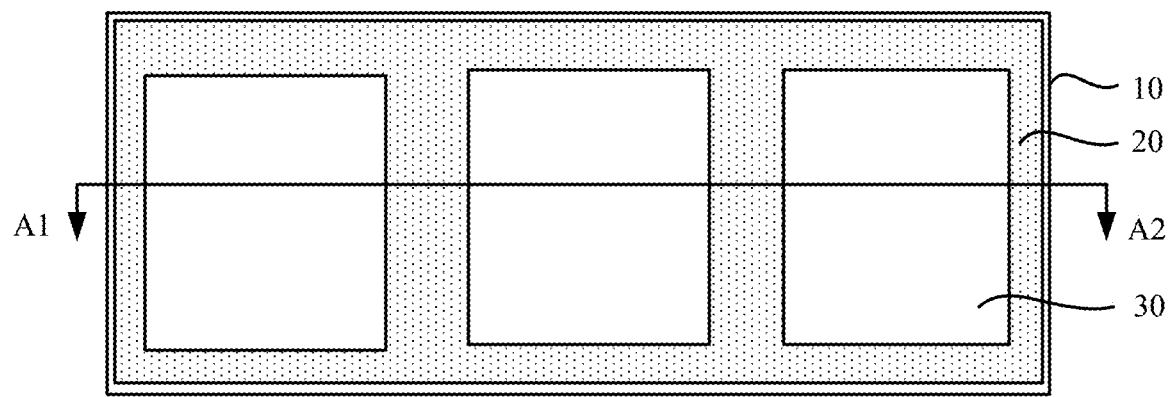
FIG. 2A is a top view of a chip package on package structure according to an embodiment of this application.

In view of this, as shown in FIG. 2A (a top view of a chip package on package structure 100), an embodiment of this application provides the chip package on package structure 100, including a primary chip stack unit 10, a first bonding layer 20, and a plurality of secondary chip stack units 30.

Figure 2B:
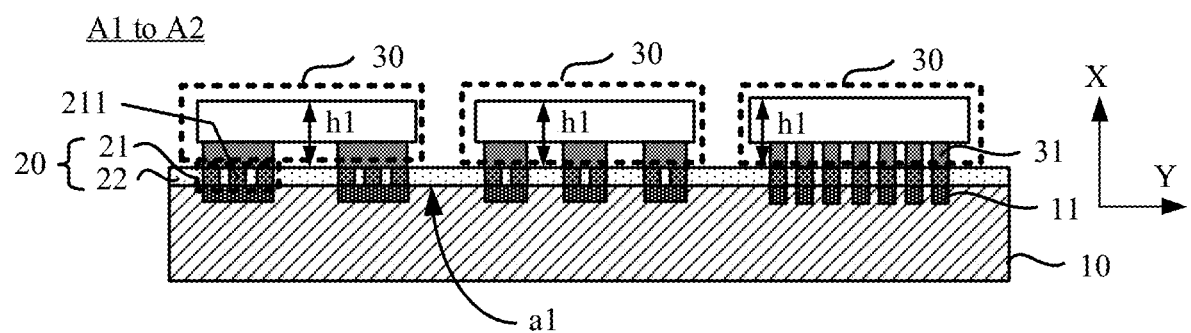
FIG. 2B is a sectional view in a direction of A1 to A2 in FIG. 2A.

As shown in FIG. 2B (a sectional view in a direction of A1 to A2 in FIG. 2A), the primary chip stack unit 10 has a first surface a1, and a plurality of primary pins 11 insulated and spaced from each other on the first surface a1.

The primary chip stack unit 10 may be an active chip, for example, a logic chip. In this case, the first surface a1 of the primary chip stack unit 10 may be an active surface of the primary chip stack unit 10, or a non-active surface of the primary chip stack unit 10. In the primary chip stack unit 10, a side on which a transistor is disposed is referred to as the active surface, and a side without a transistor is referred to as the non-active surface.

Certainly, the primary chip stack unit 10 may also be a passive chip, for example, an interposer.

Figure 2C:
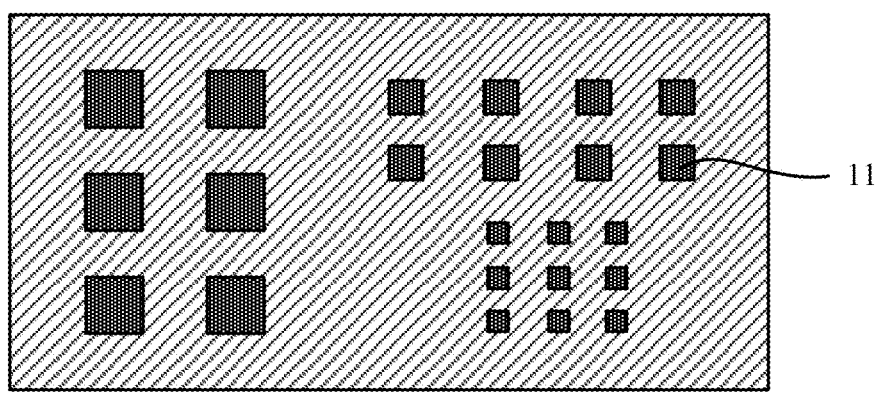
FIG. 2C is a top view of a primary chip stack unit according to an embodiment of this application.

It should be noted that cross-sectional areas of the plurality of primary pins 11 in the primary chip stack unit 10 may be the same. Certainly, for the cross-sectional areas of the plurality of primary pins 11 in the primary chip stack unit 10, as shown in FIG. 2C (a top view of the primary chip stack unit 10), the cross-sectional areas of the plurality of primary pins 11 in the primary chip stack unit 10 may alternatively be not completely the same.

In some embodiments, as shown in FIG. 2B, cross-sectional areas of primary pins 11 bonded to a same secondary chip stack unit 30 are the same, and cross-sectional areas of primary pins 11 bonded to different secondary chip stack units 30 are different.

In embodiments of this application, a first direction X is a direction from the primary chip stack unit 10 to the secondary chip stack unit 30, or is understood as a direction perpendicular to the primary chip stack unit 10. A second direction Y is perpendicular to the first direction X, or is understood as a direction parallel to the primary chip stack unit 10. A cross-sectional area refers to a cross-sectional area parallel to the second direction Y, or is understood as an area of an orthographic projection of the primary chip stack unit 10.

A shape of a cross section of the primary pin 11 includes but is not limited to a closed pattern, for example a square, a circle, or a rectangle. In FIG. 2C, the primary pin 11 is shown as a square. In addition, spacings between adjacent primary pins 11 are not limited to the same.

The chip package on package structure includes the plurality of secondary chip stack units 30. FIG. 2B shows an example in which the chip package on package structure includes three secondary chip stack units 30.

The secondary chip stack unit 30 includes a plurality of micro bumps 31 insulated and spaced from each other. A side that is of the secondary chip stack unit 30 and on which the micro bumps 31 are disposed faces the first surface a1 of the primary chip stack unit 10.

Figure 2D:
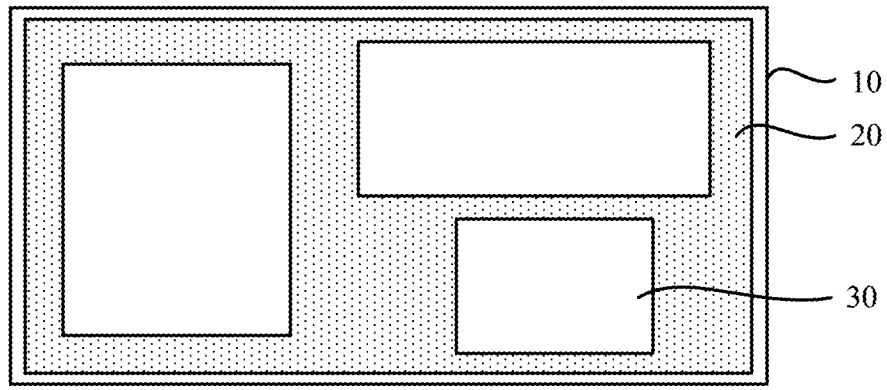
FIG. 2D is a schematic diagram of an arrangement manner of a secondary chip stack unit according to an embodiment of this application.

For the secondary chip stack unit 30 in the chip package on package structure 100, first, an arrangement manner of the plurality of secondary chip stack units 30 is not limited. As shown in FIG. 2A, the plurality of secondary chip stack units 30 may be regularly disposed in parallel. As shown in FIG. 2D (a top view of the chip package on package structure 100), the plurality of secondary chip stack units 30 may be disposed irregularly but properly.

Secondly, sizes of the plurality of secondary chip stack units 30 are not limited. As shown in FIG. 2A, cross-sectional areas of the plurality of secondary chip stack units 30 may be the same. As shown in FIG. 2D, the sizes of the plurality of secondary chip stack units 30 may alternatively be different.

Figure 2E:
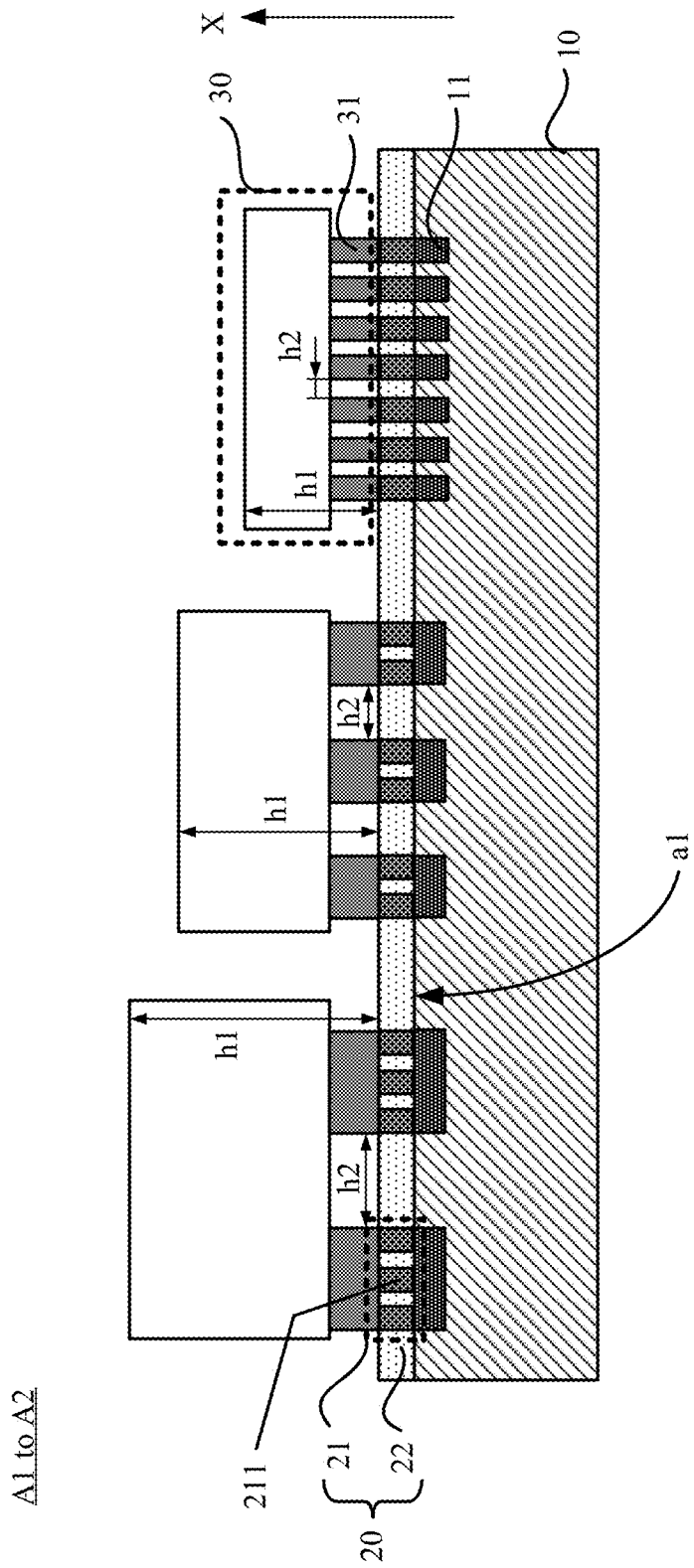
FIG. 2E is a sectional view in a direction of A1 to A2 in FIG. 2A.

As shown in FIG. 2B, thicknesses h1 of the plurality of secondary chip stack units 30 in the first direction (a direction perpendicular to the primary chip stack unit 10) X may be the same. As shown in FIG. 2E (a sectional view in the direction of A1 to A2 in FIG. 2A), the thicknesses h1 of the plurality of secondary chip stack units 30 in the first direction X may alternatively be different.

Thirdly, as shown in FIG. 2E, quantities of micro bumps 31 included in different secondary chip stack units 30 may be different, and spacings (or referred to as pitch) h2 between adjacent micro bumps 31 may also be different.

Sizes of the plurality of micro bumps 31 included in each secondary chip stack unit 30 may be different. In some embodiments, the sizes of the plurality of micro bumps 31 included in each secondary chip stack unit 30 are the same, to simplify a process and lower a design requirement.

The sizes of the micro bumps 31 of each secondary chip stack unit 30 in the plurality of secondary chip stack units 30 are not completely equal, and the size of the micro bump 31 includes a cross-sectional area of the micro bump 31 and a thickness of the micro bump 31 in the first direction X.

The sizes of the micro bumps 31 of each secondary chip stack unit 30 are not completely equal. In one case, no sizes of the micro bumps 31 of each secondary chip stack unit 30 in the plurality of secondary chip stack units 30 are completely equal. In other words, sizes of micro bumps 31 of any two secondary chip stack units 30 in the secondary chip stack unit 30 are not equal. For example, the chip package on package structure 100 includes four secondary chip stack units 30: a first secondary chip stack unit, a second secondary chip stack unit, a third secondary chip stack unit, and a fourth secondary chip stack unit. Sizes of micro bumps 31 of the four secondary chip stack units are not equal to each other.

The sizes of the micro bumps 31 of each secondary chip stack unit 30 are not completely equal. In another case, the plurality of secondary chip stack units 30 include several secondary chip stack units 30 of which sizes of micro bumps 31 are equal to each other, and further include several secondary chip stack units 30 of which sizes of micro bumps 31 are not equal to each other. For example, the chip package on package structure 100 includes four secondary chip stack units 30. Sizes of micro bumps 31 of a first secondary chip stack unit and a second secondary chip stack unit are equal, and sizes of micro bumps 31 of the first secondary chip stack unit, a third secondary chip stack unit, and a fourth secondary chip stack unit are not equal to each other.

In addition, materials of micro bump 31 included in different secondary chip stack units 30 may be different.

It should be noted that having size differences within a process error range may be understood as being equal and same in embodiments of this application.

Figure 3A:
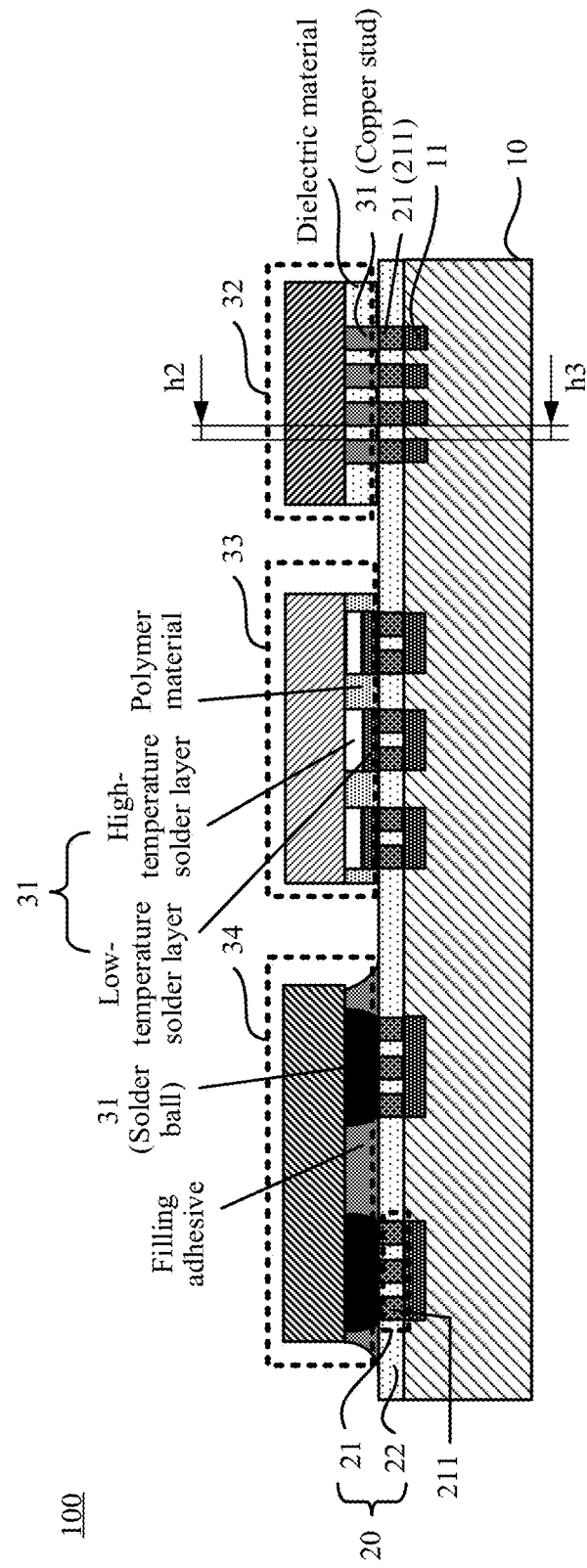
FIG. 3A is a cross-sectional view of a chip package on package structure according to an embodiment of this application.

For example, as shown in FIG. 3A (a cross-sectional view of the chip package on package structure 100), the plurality of secondary chip stack units 30 include a first secondary chip stack unit 32, a second secondary chip stack unit 33, and a third secondary chip stack unit 34.

A micro bump 31 of the first secondary chip stack unit 32 is a copper stud. A periphery of the micro bump 31 is filled with a dielectric material, and the micro bump 31 is embedded in the dielectric material, to implement insulation between adjacent copper studs. Then, the copper stud and the dielectric material are polished by using a CMP process.

Stability of metal and the dielectric material is good, and a spacing between adjacent micro bumps 31 may be, for example, less than 1 μm. The dielectric material may be, for example, silicon dioxide ($SiO_2$) or silicon nitride ($Si_3N_4$).

A micro bump 31 of the second secondary chip stack unit 33 is an embedded micro bump. The embedded micro bump includes at least one high-temperature solder layer and at least one low-temperature solder layer (for example, an embedded micro bump includes one high-temperature solder layer and one low-temperature solder layer in FIG. 3A). A solder layer closest to the primary chip stack unit 10 is the low-temperature solder layer. A periphery of the micro bump 31 is filled with a polymer material, and the micro bump 31 is embedded in the polymer material, to implement insulation between adjacent micro bumps 31. Then, the embedded micro bump and the polymer material are polished by using the chemical-mechanical planarization process.

Herein, the low-temperature solder layer and the high-temperature solder layer are relative, the high-temperature solder layer has a higher melting point than that of the low-temperature solder layer, and the low-temperature solder layer has a lower melting point than that of the high-temperature solder layer.

A spacing between adjacent micro bumps 31 may be, for example, about 5 μm. A material constituting the high-temperature solder layer may be, for example, copper (Cu), and a material constituting the low-temperature solder layer may be, for example, tin (Sn). The polymer material may be, for example, benzocyclobutene (BCB) or polyimide (PI).

A micro bump 31 of the third secondary chip stack unit 34 is a solder ball. A periphery of the solder ball is filled with a filling adhesive, to implement insulation between adjacent solder balls. A spacing between adjacent micro bumps 31 may be, for example, about 40 μm. The solder ball may be made of a material, for example, Cu/Sn or Cu/Sn/silver (Ag).

The micro bump 31 of the first secondary chip stack unit 32 has a smallest cross-sectional area, and the micro bump 31 of the third secondary chip stack unit 34 is a largest cross-sectional area.

The first secondary chip stack unit 32, the second secondary chip stack unit 33, and the third secondary chip stack unit 34 may be devices such as a memory (e.g., double data rate (DDR)), an intellectual property (IP) core, or a silicon chip (e.g., a silicon die). This can greatly shorten a process period, reduce costs, and effectively implement heterogeneous integration.

The first secondary chip stack unit 32, the second secondary chip stack unit 33, and the third secondary chip stack unit 34 may be bonded to the primary chip stack unit 10 after a good product test, to ensure a product yield. A chip that passes the good product test is referred to as a known good die (KGD).

As shown in FIG. 2B, the first bonding layer 20 is located between the primary chip stack unit 10 and the secondary chip stack unit 30.

In other words, the first bonding layer 20 is disposed on the first surface a1 of the primary chip stack unit 10, and the secondary chip stack unit 30 is disposed on a surface that is of the first bonding layer 20 and that is away from the primary chip stack unit 10.

The first bonding layer 20 includes a plurality of bonding components 21 insulated and spaced from each other. Each bonding component 21 in the plurality of bonding components 21 includes at least one bonding part 211, and any two bonding parts 211 in the plurality of bonding components 21 are insulated and spaced from each other.

For example, a periphery of the bonding part 211 may be filled with an insulation material, to form a first insulation layer 22 sleeved on the bonding part 211. In this case, any two bonding parts 211 are insulated, and the bonding part 211 passes through the first insulation layer 22 in the first direction X. The insulation material may be, for example, the polymer material or the dielectric material.

As shown in FIG. 2B, the plurality of bonding components 21 are separately bonded to the plurality of primary pins 11 and the plurality of micro bumps 31. Each primary pin 11 in the plurality of primary pins 11 is bonded to at least one bonding part 211 in a bonding component 21 bonded to the primary pin 11. Each micro bump 31 in the plurality of micro bumps 31 is bonded to at least one bonding part 211 in a bonding component 21 bonded to the micro bump 31.

Herein, the plurality of bonding components 21 are separately bonded to the plurality of primary pins 11 and the plurality of micro bumps 31. It may alternatively be understood that, as shown in FIG. 2B, two ends of each bonding component 21 are bonded to one primary pin 11 and one micro bump 31 respectively, to bond the primary pin 11 and the micro bump 31. It may be understood that, to ensure bonding of the primary pin 11 and the micro bump 31, a primary pin 11 and a micro bump 31 that are bonded to a same bonding component 21 should be bonded to at least one same bonding part 211 in the bonding component 21.

Bonding refers to a process in which two homogeneous or heterogeneous materials are directly combined under a specific condition after surface processing, to electrically or mechanically interconnect the two materials.

A manner of bonding the bonding component 21 and the primary pin 11 may be, for example, direct contact bonding when the bonding component 21 is manufactured. A manner of bonding the micro bump 31 and the bonding component 21 may be processes such as micro bump bonding, embedded micro bump bonding, hybrid bonding (HB), surface activated bonding (SAB), atomic diffusion bonding (ADB), and wire bonding (WB), to implement bonding.

For a secondary chip stack unit 30 that has a high bandwidth/bit width requirement, processes such as embedded micro bump bonding, hybrid bonding, surface activated bonding, or atomic diffusion bonding may be used, to reduce a spacing between bump micros 31, improve an integration degree, and reduce a delay. For a secondary chip stack unit 30 that does not have a high bandwidth/bit width requirement, processes such as wire bonding or micro bump bonding may be used, to reduce costs.

The micro bump 31 of the first secondary chip stack unit 32 in FIG. 3A is the copper stud. The first secondary chip stack unit 32 uses a hybrid bonding process to bond the micro bump 31 and the bonding part 211 by using thermo compression bonding. The hybrid bonding has a very high requirement on cleanliness and roughness of a bonding interface, and the roughness is required as the order of 0.5 nm.

When a material of the bonding part 211 is copper, a material of the micro bump 31 is the same as the material of the bonding part 211, and bonding of the micro bump 31 and the bonding part 211 is metal-to-metal direct bonding. When the insulation material filled on the periphery of the bonding part 211 is a dielectric material, the dielectric material on the periphery of the micro bump 31 and the dielectric material on the periphery of the bonding part 211 may be further bonded.

The micro bump 31 of the second secondary chip stack unit 33 is the embedded micro bump. The second secondary chip stack unit 33 uses an embedded micro bump bonding process to bond the micro bump 31 and the bonding part 211 by using thermo compression or high temperature reflow. A material of the micro bump 31 is different from the material of the bonding part 211, and bonding of the micro bump 31 and the bonding part 211 is eutectic bonding.

When the insulation material filled on the periphery of the bonding part 211 is a polymer material, the polymer material on the periphery of the micro bump 31 and the polymer material on the periphery of the bonding part 211 may be further bonded.

The micro bump 31 of the third secondary chip stack unit 34 is the solder ball. The third secondary chip stack unit 34 uses a micro bump bonding process to bond the micro bump 31 and the bonding part 211 by using thermo compression or high temperature reflow.

A material of the micro bump 31 is different from the material of the bonding part 211, and bonding of the micro bump 31 and the bonding part 211 is eutectic bonding.

Figure 3B:
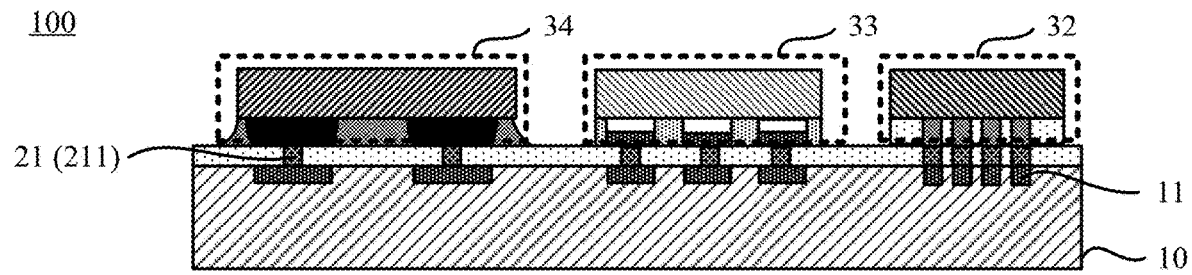
FIG. 3B is a cross-sectional view of another chip package on package structure according to an embodiment of this application.

For a quantity of the bonding parts 211 included in the bonding component 21, in some embodiments, quantities of bonding parts 211 included in all bonding components 21 are equal as shown in FIG. 3B (a cross-sectional view of the chip package on package structure 100). FIG. 3B shows an example in which the bonding component 21 includes one bonding part 211.

Figure 3C:
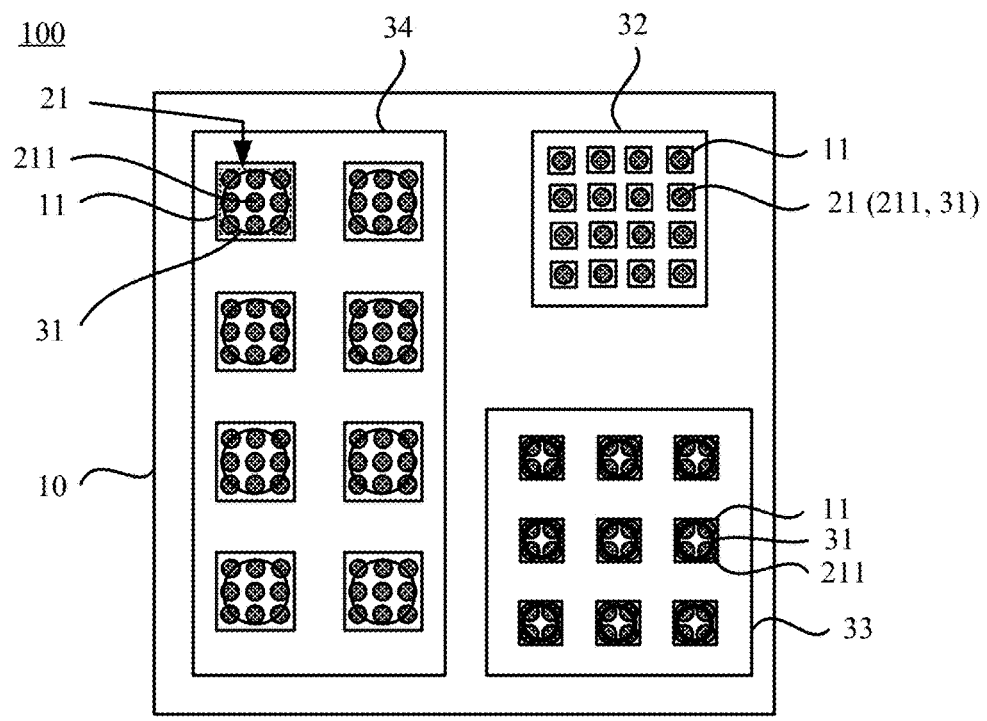
FIG. 3C is a top view of a bonding part, a primary pin, and a micro bump according to an embodiment of this application.

In other embodiments, quantities of bonding parts 211 included in all bonding components 21 are not completely equal as shown in FIG. 3C (a top view of the chip package on package structure 100).

For example, in the plurality of bonding components 21, a quantity of bonding parts 211 in a bonding component 21 bonded to a micro bump 31 having a large cross-sectional area is greater than a quantity of bonding parts 211 in a bonding component 21 bonded to a micro bump 31 having a small cross-sectional area as shown in FIG. 3C.

In other words, a micro bump 31 has a larger cross-sectional area, indicating that a bonding component 21 bonded to the micro bump 31 includes a larger quantity of bonding parts 211. For example, a micro bump 31 of the third secondary chip stack unit 34 has a largest cross-sectional area, and a bonding component 21 bonded to the micro bump 31 includes three bonding parts 211. A micro bump 31 of the second secondary chip stack unit 33 has a second largest cross-sectional area, and a bonding component 21 bonded to the micro bump 31 includes two bonding parts 211. A micro bump 31 of the first secondary chip stack unit 32 has a smallest cross-sectional area, and a bonding component 21 bonded to the micro bump 31 includes one bonding part 211.

In this way, the quantity of bonding parts 211 in the bonding component 21 may be adjusted based on the cross-sectional area of the micro bump 31, and a contact area between each bonding component 21 and each micro bump 31 is not very small. This ensures a bonding effect between the bonding component 21 and the micro bump 31.

In some embodiments, bonding components 21 bonded to a same secondary chip stack unit 30 include an equal quantity of bonding parts 211 as shown in FIG. 3C, to reduce types of bonding components 21 and reduce process difficulty.

Figure 4:
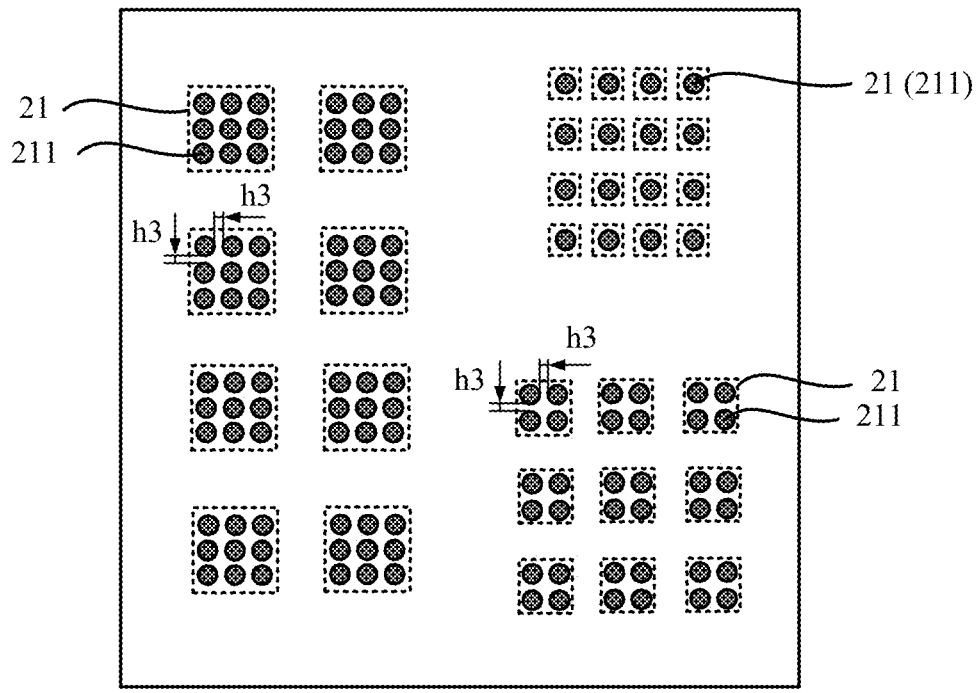
FIG. 4 is a schematic top view of a first bonding layer according to an embodiment of this application.

As shown in FIG. 4 (a top view of the first bonding layer 20), quantities of bonding parts 211 included in different bonding components 21 may not be the same, but any two bonding parts 211 in the first bonding layer 20 have a same cross-sectional area.

For example, in some embodiments, any two bonding parts 211 in the first bonding layer 20 have cross sections of a same shape as shown in FIG. 4. For example, a shape of a cross section of the bonding part 211 is a closed pattern, for example, a circle or a rectangle.

In embodiments of this application, a cross-sectional area and a shape of a cross section of the bonding part 211 are not limited.

In a fixed range, if the bonding part 211 has a large cross-sectional area, adjacent bonding parts 211 may have a small spacing and may be bonded. In some embodiments, a cross-sectional area of the bonding part 211 is less than or equal to a cross-sectional area of a micro bump 31 having a smallest cross-sectional area, to reduce a bonding probability of adjacent bonding parts 211.

For example, when cross-sectional areas of micro bumps 31 in the plurality of secondary chip stack units are different, a cross-sectional area of the bonding part 211 is equal to a cross-sectional area of a micro bump 31 having a smallest cross-sectional area.

Because the bonding part 211 has a large cross-sectional area, adjacent bonding parts 211 may have a small spacing and may be bonded. A small cross-sectional area of the bonding part 211 may increase difficulty of a manufacturing process. Therefore, in embodiments of this application, the cross-sectional area of the bonding part 211 is equal to the cross-sectional area of the micro bump 31 having the smallest cross-sectional area. This can implement a largest bonding contact surface between the bonding part 211 and the micro bump 31 having the smallest cross-sectional area, to improve a bonding effect of the two. In addition, the cross-sectional area of the bonding part 211 does not need to be excessively large or small, to reduce the bonding probability of the adjacent bonding parts 211 and reduce process difficulty.

As shown in FIG. 3A, the micro bump 31 (e.g., a copper stud) of the first secondary chip stack unit 32 has the smallest cross-sectional area, and the cross-sectional area of the bonding part 211 is equal to a cross-sectional area of the micro bump 31 of the first secondary chip stack unit 32.

Figure 5A:
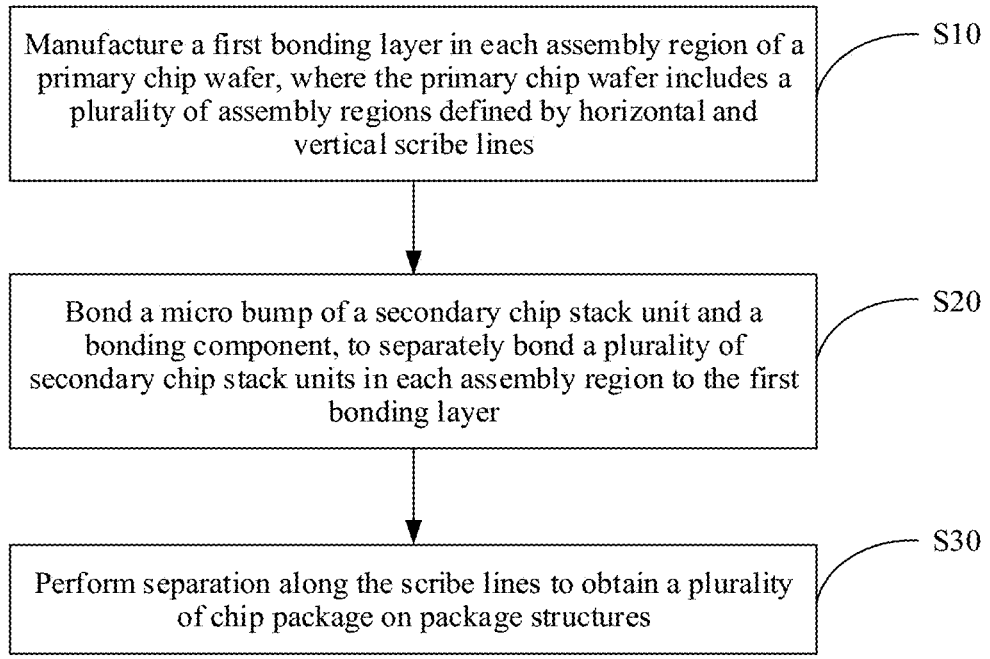
FIG. 5A is a flowchart of a packaging method of a chip package on package structure according to an embodiment of this application.

In the chip package on package structure 100 shown in FIG. 3A, bonding of the plurality of secondary chip stack units 30 and primary chip stack unit 10 is chip-to-chip bonding (chip-to-chip). As shown in FIG. 5A, the following is a packaging method of the chip package on package structure 100 formed through bonding the plurality of secondary chip stack units 30 and the primary chip stack unit 10.

Figure 5B:
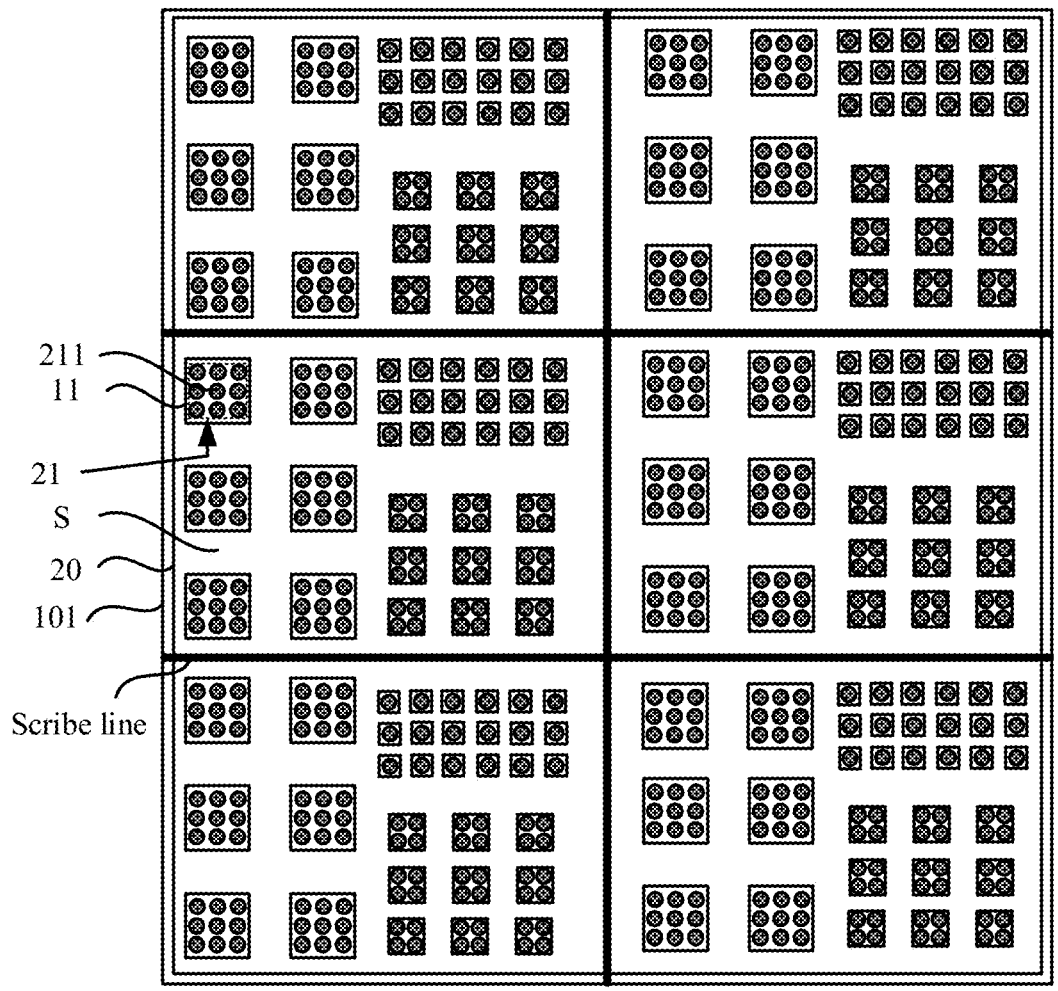
FIG. 5B to FIG. 5F are schematic diagrams of a process of bonding a primary chip stack unit and a secondary chip stack unit according to an embodiment of this application.

S10: As shown in FIG. 5B, manufacture a first bonding layer 20 in each assembly region S of a primary wafer 101, where the primary wafer 101 includes a plurality of assembly regions S defined by horizontal and vertical scribe lines.

The first bonding layers 20 in the plurality of assembly regions S may be obtained through manufacturing by using a same process. An assembly region S is used as an example.

Figure 5C:
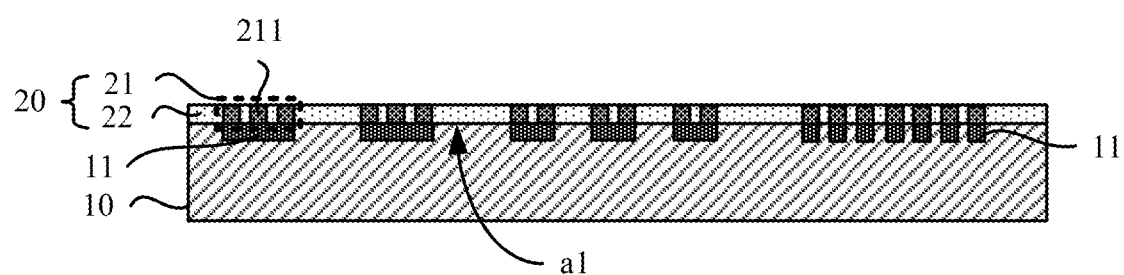

From a cross-sectional view as shown in FIG. 5C, a bonding part 21 in the first bonding layer 20 is bonded to a primary pin 11 in the primary wafer 101.

S20: Bond a micro bump 31 of a secondary chip stack unit 30 and the bonding component 21, to separately bond at least two secondary chip stack units 30 in each assembly region S to the first bonding layer 20. FIG. 3A shows one assembly region S as an example.

A same type of secondary chip stack units 30 (for example, a first secondary chip stack unit 32 in each assembly region S) in different assembly regions S may be simultaneously bonded in a single bonding process.

In this case, bonding of the secondary chip stack unit 30 and the primary wafer 101 is chip-to-wafer bonding (chip-to-wafer). Wafer refers to a silicon chip used for manufacturing a silicon semiconductor integrated circuit. The silicon chip is circular, and therefore it is referred to as a wafer.

S30: Perform separation along the scribe lines to obtain a plurality of chip package on package structures 100.

In this case, bonding of the obtained chip package on package structures 100 is chip-to-chip bonding.

Figure 5D:
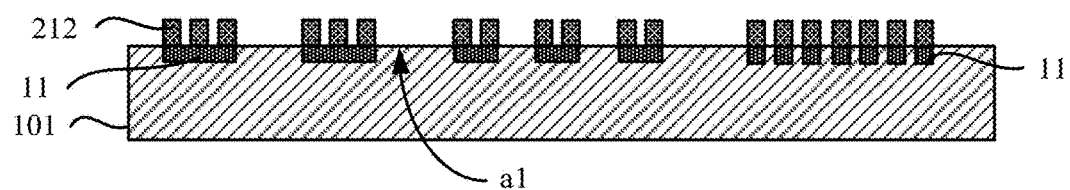

An assembly region S is used as an example. In some embodiments, as shown in FIG. 5G, step S10 includes the following steps:

S11: As shown in FIG. 5D, form a plurality of bonding studs 212 having an equal cross-sectional area and spaced from each other on a first surface a1 of the primary wafer 101. Each primary pin 11 is bonded to at least one bonding stud 212.

For example, the bonding stud 212 may be formed by using an electroplating process. That the bonding stud 212 is formed by using an electroplating process includes:

First, a seed layer is sputtered on the first surface a1 of the primary wafer 101. A material of the seed layer may be, for example, titanium (Ti) or Cu. A thickness of the seed layer may be, for example, 100 nm to 200 nm.

Figure 5E:
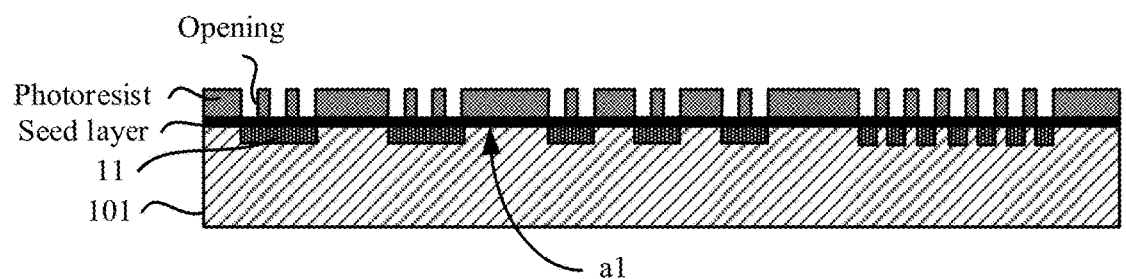

Then, as shown in FIG. 5E, a photoresist is spin-coated on the seed layer, and an opening is made through exposure and development at a position of a bonding stud 212 to be formed. A size of the opening matches a size of the bonding stud 212 to be formed.

Then, a structure in FIG. 5E is placed in an electroplating solution for electroplating, and the electroplating is stopped when the electroplated structure reaches a proper thickness. The photoresist is removed, and a seed layer not covered by the bonding stud 212 is removed, to form the bonding stud 212 shown in FIG. 5D. The bonding stud 212 includes a part electroplated in the electroplating solution and a seed layer part.

Figure 5F:
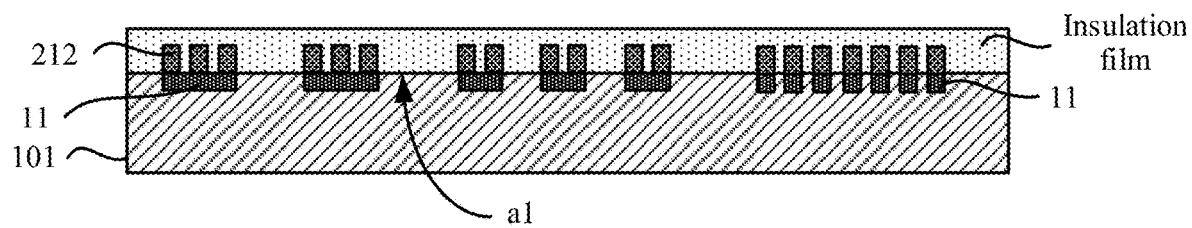
Figure 5G:
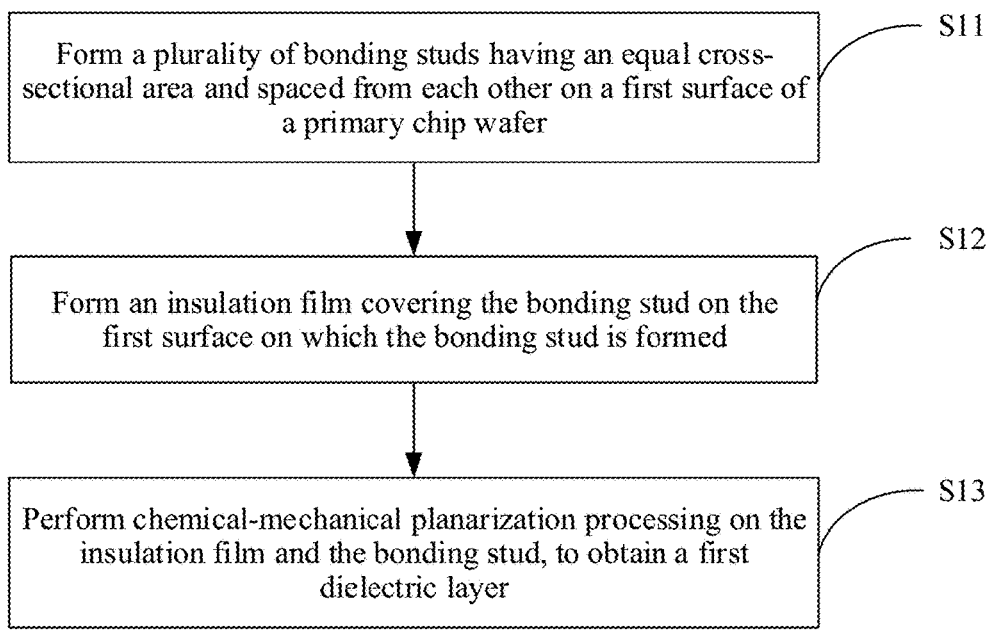
FIG. 5G is a flowchart of a method for manufacturing a first bonding layer according to an embodiment of this application.

S12: As shown in FIG. 5F, form an insulation film covering the bonding stud 212 on the first surface a1 on which the bonding stud 212 is formed.

For example, the insulation film may be formed by using a chemical vapor deposition (CVD) method.

S13: Perform chemical-mechanical planarization processing on the insulation film and the bonding stud 212, to obtain the first bonding layer 20.

For example, the insulation film and the bonding stud 212 are polished until a bonding part 211 with a proper thickness is left, and a plurality of bonding parts 211 and a first insulation layer 22 sleeved on the bonding parts 211 shown in FIG. 5C are formed, to obtain the first bonding layer 20. Bonding parts 211 bonded to a same primary pin 11 are used as a bonding component 21.

During manufacturing of the first bonding layer 20, to improve uniformity of surface roughness of each bonding part 211 in the first bonding layer 20, in some embodiments, when a bonding component 21 includes a plurality of bonding parts 211, spacings h3 between adjacent bonding parts 211 in a same bonding component 21 are equal as shown in FIG. 4.

When the first bonding layer 20 is manufactured by using the CMP process, a balance between chemical corrosion and mechanical grinding in the CMP process is required, to obtain bonding parts 211 having similar surface flatness. However, when the spacings h3 between adjacent bonding parts 211 are different, surfaces in contact with a polishing liquid have different degrees of chemical corrosion, and the bonding parts 211 obtained through mechanical grinding have different surface flatness. Therefore, the spacings h3 between adjacent bonding parts 211 in the same bonding component 21 are set to be equal. This can improve uniformity of surface roughness of all bonding parts 211 in the first bonding layer 20, to improve reliability of bonding the bonding part 211 and the micro bump 31.

In some embodiments, a spacing h2 between adjacent micro bumps 31 of a secondary chip stack unit 10 having micro bumps 31 of a smallest cross-sectional area is equal to a spacing h3 between adjacent bonding parts 211 in a same bonding component 21.

The chip package on package structure 100 shown in FIG. 3A is used as an example. The micro bump 31 (e.g., a copper stud) of the first secondary chip stack unit 32 has a smallest cross-sectional area. In this case, the spacing h3 between adjacent bonding parts 211 in the same bonding component 21 is equal to a spacing h2 between micro bumps 31 of the first secondary chip stack unit 32.

In this case, the bonding part 211 is in a one-to-one correspondence with the micro bump 31 having the smallest cross-sectional area. This ensures reliable bonding of the bonding part 211 and the micro bump 31. In addition, the bonding part 211 and the spacing h2 between the bonding parts 211 do not need to be excessively small. In this way, requirements on the manufacturing process of the bonding part 211 can be lowered.

In some chip package on package structures 100, bonding temperatures are different when micro bumps 31 of a plurality of secondary chip stack units 30 are bonded to the first bonding layer 20. Therefore, in some embodiments, step S20 includes: sort the plurality of secondary chip stack units 30 in a descending order of bonding temperatures of the micro bumps 31 of the plurality of secondary chip stack units 30, and sequentially bond the plurality of secondary chip stack units 30 to the first bonding layer 20.

The chip package on package structure 100 shown in FIG. 3A is used as an example. The first secondary chip stack unit 32 is bonded to the first bonding layer 20 by using a hybrid bonding process, and a bonding temperature is 220° C. to 250° C. The second secondary chip stack unit 33 is bonded to the first bonding layer 20 by using an embedded micro bump bonding process, and a bonding temperature is 220°

C. or below. The third secondary chip stack unit 34 is bonded to the first bonding layer 20 by using a micro bump bonding process, and a bonding temperature is 260° C. or above.

The first secondary chip stack unit 32, the second secondary chip stack unit 33, and the third secondary chip stack unit 34 are sorted in the descending order of the bonding temperatures of the micro bumps 31, and a sorting order is: the third secondary chip stack unit 34, the first secondary chip stack unit 32, and the second secondary chip stack unit 33.

When the three secondary chip stack units are separately bonded to the first bonding layer 20, the third secondary chip stack unit 34 in the assembly region S is first bonded to the first bonding layer 20 in a same bonding process. Then, the first secondary chip stack unit 32 in each assembly region S is bonded to the first bonding layer 20 in a same bonding process. Finally, the second secondary chip stack unit 33 in each assembly region S is bonded to the first bonding layer 20 in a same bonding process.

In embodiments of this application, the micro bump 31 and the primary pin 11 are bonded by using the bonding component 21, to separately bond the plurality of secondary chip stack units 30 to the primary chip stack unit 10. In addition, because any two bonding parts 211 in the first bonding layer 20 have an equal cross-sectional area (or understood as having a same feature size), when the bonding parts 211 in the first bonding layer 20 are manufactured by using a same process, surfaces of the manufactured bonding parts 211 are planes of similar roughness. In this way, regardless of whether cross-sectional areas of the micro bumps 31 of the plurality of secondary chip stack units 30 are equal, because the surface of the bonding part 211 in contact with the micro bump 31 is a plane, the bonding part 211 may be in close contact with the micro bump 31. Therefore, regardless of which bonding process is used, whether the cross-sectional areas of the micro bumps 31 are the same, or whether the spacings between adjacent micro bumps 31 are equal, the bonding part 211 can be reliably bonded to the micro bump 31. This ensures bonding strength of the primary chip stack unit 10 and the plurality of secondary chip stack units 30, and electrical performance and reliability after bonding.

Figure 6A:
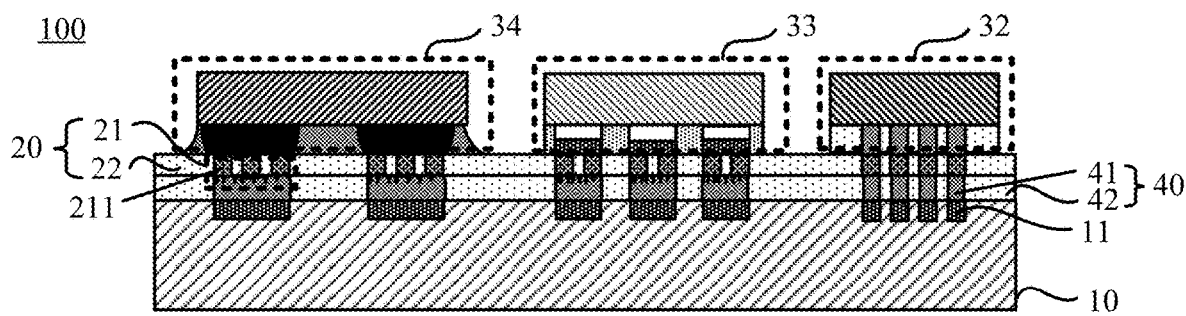
FIG. 6A is a cross-sectional view of still another chip package on package structure according to an embodiment of this application.

Based on any one of the foregoing chip package on package structures 100, as shown in FIG. 6A (a cross-sectional view of the chip package on package structure 100), the chip package on package structure 100 further includes a second bonding layer 40, and the second bonding layer 40 is disposed between the primary chip stack unit 10 and the first bonding layer 20.

The second bonding layer 40 includes a plurality of auxiliary pins 41 insulated and spaced from each other. Two ends of each of the plurality of auxiliary pins 41 are bonded to each of the plurality of primary pins 11 and each of the plurality of bonding components 21 respectively, and each of the plurality of auxiliary pins 41 is bonded to at least one bonding part 211 in a bonding component 21 bonded to the auxiliary pin 41.

Figure 6B:
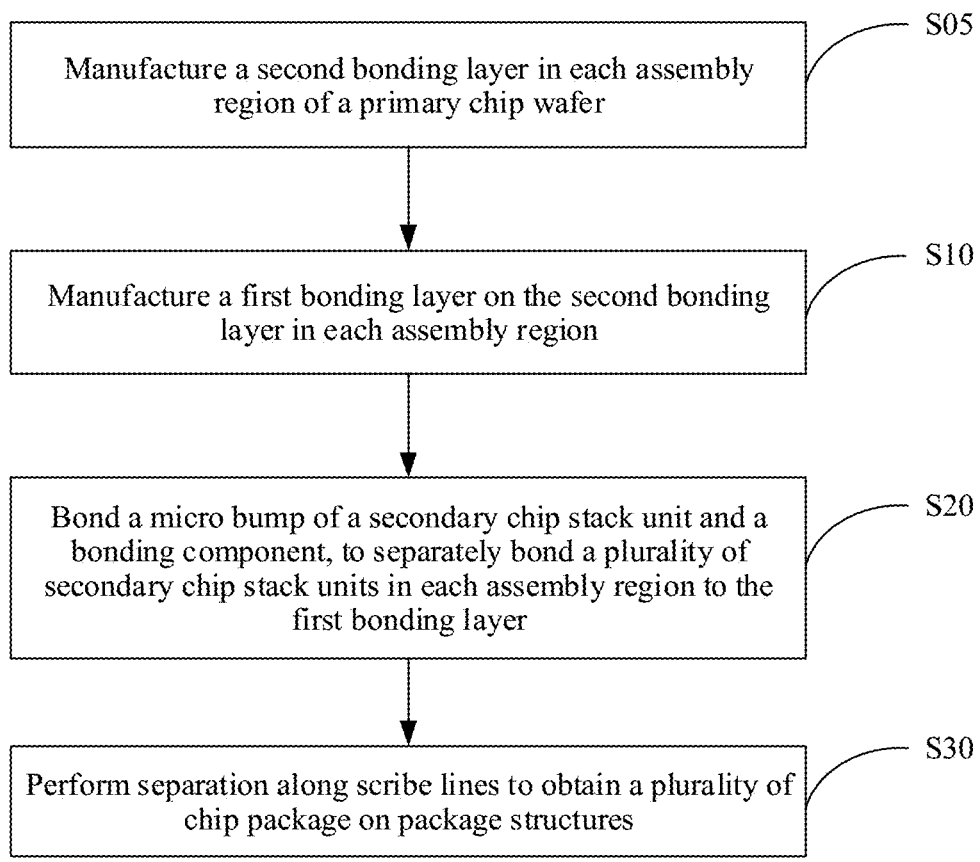
FIG. 6B is a flowchart of another packaging method of a chip package on package structure according to an embodiment of this application.

To form the chip package on package structure 100 shown in FIG. 6A, as shown in FIG. 6B, before the first bonding layer 20 is formed, the packaging method of the chip package on package structure further includes the following step:

S05: Manufacture the second bonding layer 40 in each assembly region S of the primary wafer 101.

In this case, step S10 includes: manufacturing the first bonding layer 20 on the second bonding layer 40 in each assembly region S.

A process for manufacturing the second bonding layer 40 may be the same as the process for manufacturing the first bonding layer 20. As shown in FIG. 6A, the second bonding layer 40 finally formed includes a second insulation layer 42 sleeved on the auxiliary pin 41. In this case, any two auxiliary pins 41 are insulated, and the auxiliary pin 41 passes through the second insulation layer 42 in the first direction X.

The second bonding layer 40 is directly formed on some primary chip stack units sold in the existing markets. This structure may also be applicable to a solution in which the secondary chip stack unit 30 is bonded by using the bonding component 21 in the present disclosure. This can expand an application scope of the chip package on package structure 100.

A large cross-sectional area of the auxiliary pin 41 may increase a bonding possibility of adjacent auxiliary pins 41. A small cross-sectional area of the auxiliary pin 41 may affect a bonding effect of the bonding component 21 and the auxiliary pin 41, and affect signal transmission on the primary pin 31. Therefore, in some embodiments, the auxiliary pin 41 and the micro bump 31 bonded by using the bonding component 21 have an equal cross-sectional area as shown in FIG. 6A.

Figure 6C:
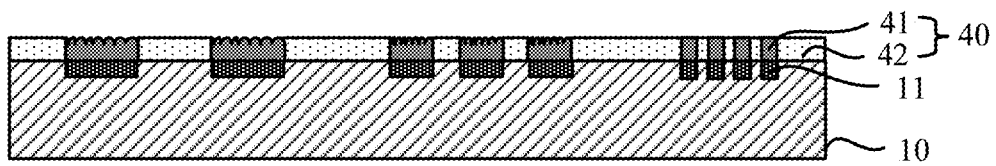
FIG. 6C is a schematic diagram of surface roughness of an auxiliary solder pad in a second bonding layer according to an embodiment of this application.

It should be noted that, as shown in FIG. 6C, when the second bonding layer 40 is manufactured by using the process of manufacturing the first bonding layer 20, because cross-sectional areas of all auxiliary pins 41 differ greatly, excessive chemical-mechanical planarization processing is performed on a surface of an auxiliary pin 41 having a largest cross-sectional area when a surface of an auxiliary pin 41 having a smallest cross-sectional area meets a roughness requirement. Therefore, surfaces of the auxiliary pins 41 manufactured by using the CMP process differ greatly in roughness. In this case, when a bonding stud 212 is manufactured by using an electroplating process, a thickness of a formed seed layer may be adjusted based on the roughness of the auxiliary pin 41, to ensure obtaining a bonding stud 212 having an ideal thickness.

A structure of the chip package on package structure 100 provided in embodiments of this application is described below by using several detailed embodiments as examples.

Embodiment 1

Figure 7A:
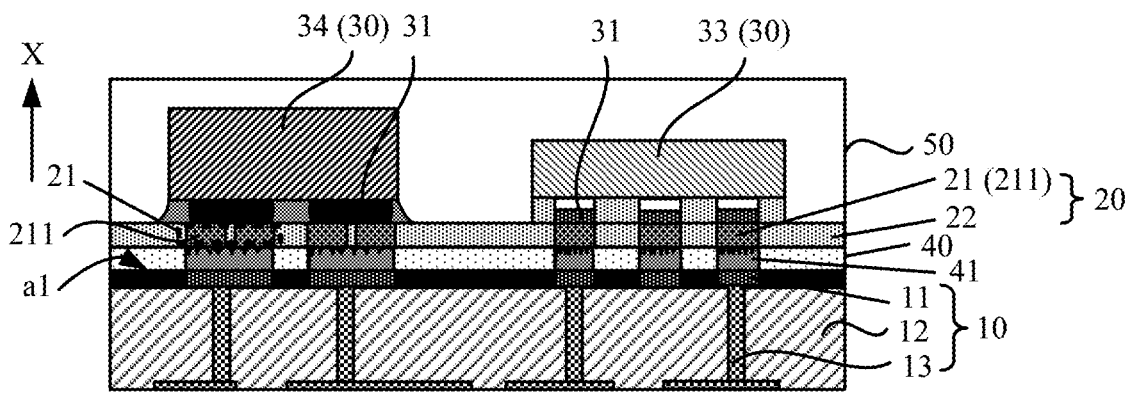
FIG. 7A is a cross-sectional view of still another chip package on package structure according to an embodiment of this application.

As shown in FIG. 7A (a cross-sectional view of a chip package on package structure 100), the chip package on package structure 100 includes a primary chip stack unit 10, a first bonding layer 20, a plurality of secondary chip stack units 30, a second bonding layer 40, and a second molding layer 50.

The primary chip stack unit 10 includes a primary die (e.g., a bare die) 12. The primary die 12 has a plurality of first through silicon vias (TSVs) 13 passing through the primary die 12. An active surface of the primary die 12 is used as a first surface a1. The first through silicon via 13 is bonded to a primary pin 11.

The second bonding layer 40 is located on the first surface a1 of the primary chip stack unit 10. The second bonding layer 40 includes a plurality of auxiliary pins 41 insulated and spaced from each other, and one auxiliary pin 41 is bonded to one primary pin 11.

The first bonding layer 20 is located on a surface that is of the second bonding layer 40 and that is away from the primary chip stack unit 10. The first bonding layer 20 includes a plurality of bonding components 21 insulated and spaced from each other. Each bonding component 21 includes at least one bonding part 211, and any two bonding parts 211 are insulated. Any two bonding parts 211 have an equal size in a first direction X, and each bonding part 211 in a same bonding component 21 is bonded to a same auxiliary pin 41.

The plurality of secondary chip stack units include the second secondary chip stack unit 33 and the third secondary chip stack unit 34. A micro bump 31 of the second secondary chip stack unit 33 is an embedded micro bump, and each micro bump 31 is bonded to each bonding part 211 in one bonding component 21 in the first bonding layer 20 by using an embedded bonding process. A micro bump 31 of the third secondary chip stack unit 34 is a solder ball, and each micro bump 31 is bonded to each bonding part 211 in one bonding component 21 in the first bonding layer 20 by using a micro bump bonding process.

Active surfaces of the second secondary chip stack unit 33 and the third secondary chip stack unit 34 face the primary chip stack unit 10. The plurality of secondary chip stack units 30 are electrically interconnected with the primary chip stack unit 10 through active surface-to-active surface (e.g., face to face (F2F)).

As shown in FIG. 7A, a cross-sectional area of each bonding part 211 is equal to a cross-sectional area of the micro bump 31 of the second secondary chip stack unit 33. A material of the first insulation layer 22 is a polymer material, and is the same as a material filled on a periphery of the micro bump 31 of the second secondary chip stack unit 33.

In this way, when the micro bump 31 of the second secondary chip stack unit 33 is bonded to the bonding component 21 in the first bonding layer 20 by using the embedded bonding process, the polymer material on the periphery of the micro bump 31 is also bonded to the first insulation layer 22. This can improve bonding reliability.

An auxiliary solder pad 41 and a micro bump 31 bonded by using a same bonding component 21 have a same cross-sectional area.

Figure 7B:
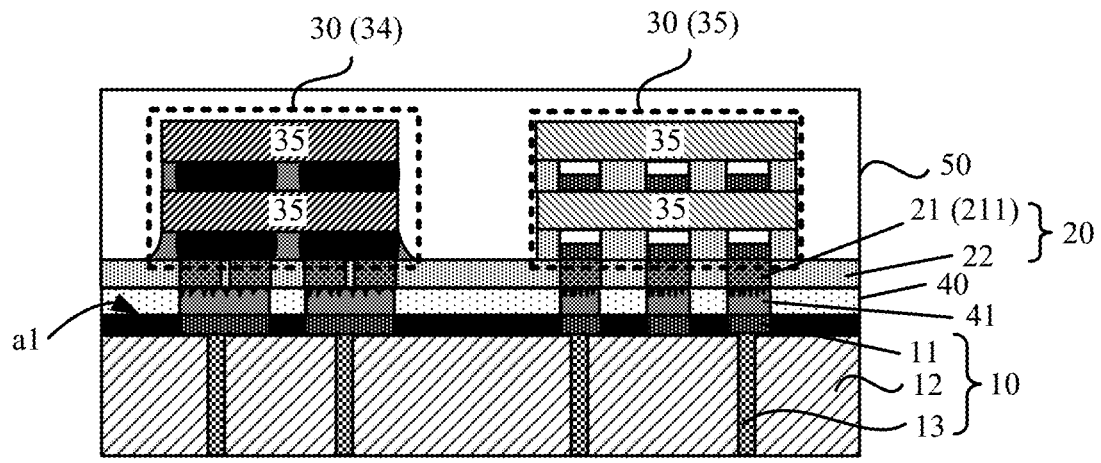
FIG. 7B is a cross-sectional view of still another chip package on package structure according to an embodiment of this application.

In order to add a function of the secondary chip stack unit 30 without increasing an occupied area of the secondary chip stack unit 30, in some embodiments, as shown in FIG. 7B (a cross-sectional view of the chip package on package structure 100), the secondary chip stack unit 30 includes a plurality of stacked secondary dies 35, adjacent secondary dies 35 are bonded, and a secondary die 35 closest to the first bonding layer 20 is bonded to the first bonding layer 20.

The secondary dies 35 are bonded by using wire bonding. Alternatively, the secondary die 35 may include a TSV, and TSVs in adjacent secondary dies 35 are bonded between the secondary dies 35 by using one process of micro bump bonding, embedded micro bump bonding, hybrid bonding, surface activated bonding, and atomic diffusion bonding, to implement bonding of adjacent secondary dies 35.

In some embodiments, as shown in FIG. 7B, a manner in which adjacent secondary dies 35 are bonded is the same as a manner in which the secondary die 35 closest to the first bonding layer 20 is bonded to the first bonding layer 20, to lower a design requirement.

To be specific, the second secondary chip stack unit 33 is bonded to the first bonding layer 20 by using an embedded micro bump bonding process, and a plurality of secondary dies 35 included in the second secondary chip stack unit 33 are also bonded by using the embedded micro bump bonding process. The third secondary chip stack unit 34 is bonded to the first bonding layer 20 by using a micro bump bonding process, and a plurality of secondary dies 35 included in the third secondary chip stack unit 34 are also bonded by using the micro bump bonding process.

As shown in FIG. 7B, a second molding layer 50 covers the secondary chip stack unit 30 on a side away from the primary chip stack unit 10, and performs molding protection for the secondary chip stack unit 30.

A material of the second molding layer 50 may be, for example, a molding material (molding) or an insulation material.

Figure 7C:
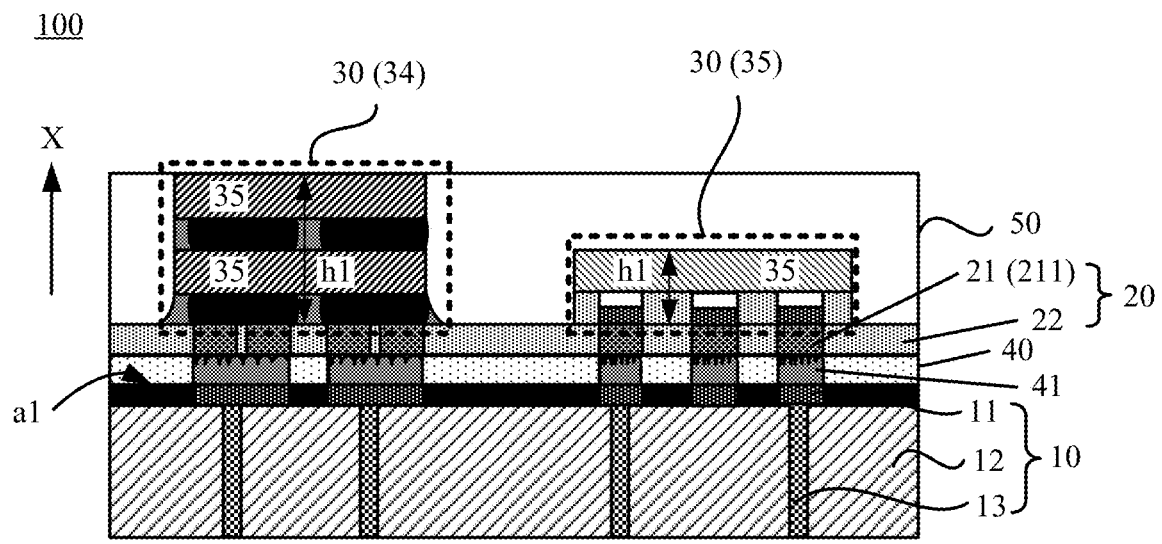
FIG. 7C is a cross-sectional view of still another chip package on package structure according to an embodiment of this application.

Because a heat dissipating effect of the molding layer 50 is poor, in some embodiments, in a direction (e.g., the first direction X) perpendicular to the primary chip stack unit 10, a surface of a secondary chip stack unit 30 of a larger size h1 in the plurality of secondary chip stack units 30 is aligned with a surface that is of the second molding layer 50 and that is away from the primary chip stack unit 10 as shown in FIG. 7C (a cross-sectional view of the chip package on package structure 100).

In other words, after the chip package on package structure 100 shown in FIG. 7A is manufactured, a surface that is of the secondary chip stack unit 30 and that is away from the primary chip stack unit 10 is exposed through grinding, to reduce a thickness and a thermal resistance of the second molding layer 50.

Figure 7D:
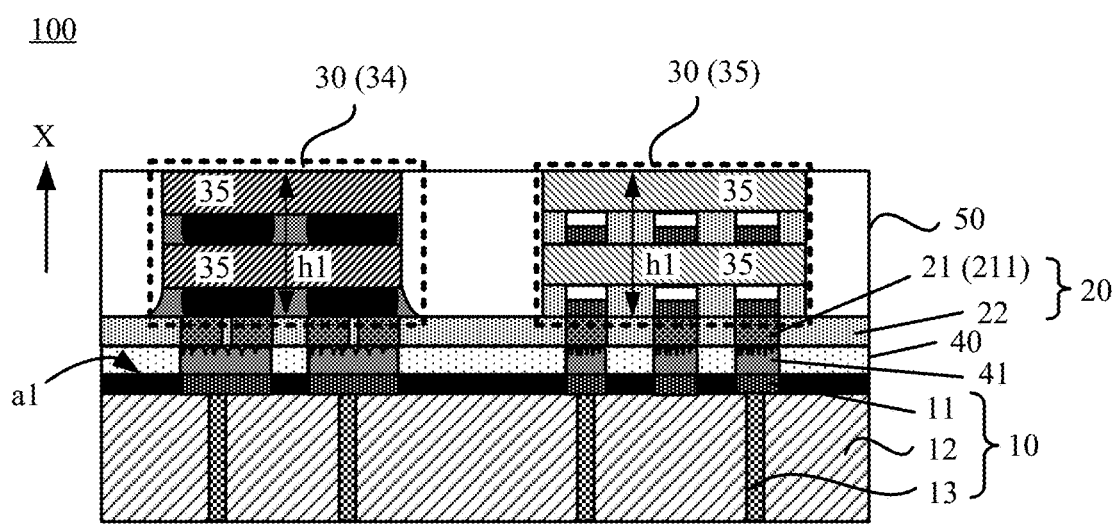
FIG. 7D is a cross-sectional view of still another chip package on package structure according to an embodiment of this application.

Certainly, as shown in FIG. 7D (a cross-sectional view of the chip package on package structure 100), when the plurality of secondary chip stack units 30 have an equal size h1 in the first direction X, a surface that is of each secondary chip stack unit 30 and that is away from the primary chip stack unit 10 is aligned with a surface that is of the second molding layer 50 and that is away from the primary chip stack unit 10.

Figure 8:
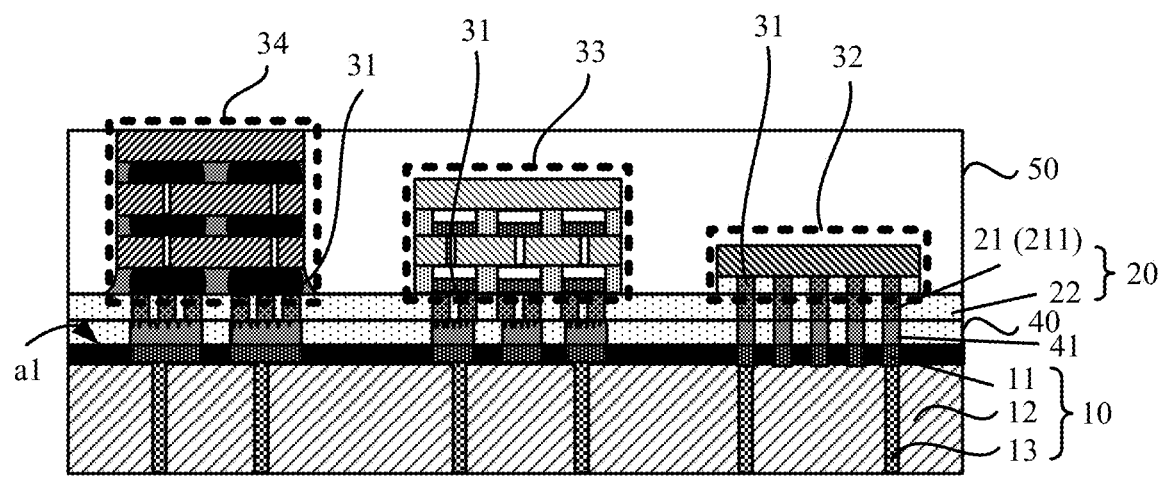
FIG. 8 is a cross-sectional view of still another chip package on package structure according to an embodiment of this application.

In some embodiments, as shown in FIG. 8 (a cross-sectional view of the chip package on package structure 100), the plurality of secondary chip stack units further include the first secondary chip stack unit 32. A micro bump 31 of the first secondary chip stack unit 32 is a copper stud, and each micro bump 31 is bonded to each bonding part 211 in one bonding component 21 in the first bonding layer 20 by using a hybrid bonding process.

In this case, a cross-sectional area of the micro bump 31 of the first secondary chip stack unit 32 is less than a cross-sectional area of the micro bump 31 of the second secondary chip stack unit 33. Therefore, a cross-sectional area of each bonding part 211 is equal to the cross-sectional area of the micro bump 31 of the first secondary chip stack unit 32. A material of the first insulation layer 22 is a dielectric material, and is the same as a material filled on a periphery of the micro bump 31 of the first secondary chip stack unit 32.

When the chip package on package structure 100 shown in FIG. 8 needs to be bonded to a PCB, the PCB is located on a side that is of the primary chip stack unit 10 and that is away from the first bonding layer 20, and the first through silicon via 13 of the primary chip stack unit 10 is bonded to the PCB by using a solder ball.

Figure 9A:
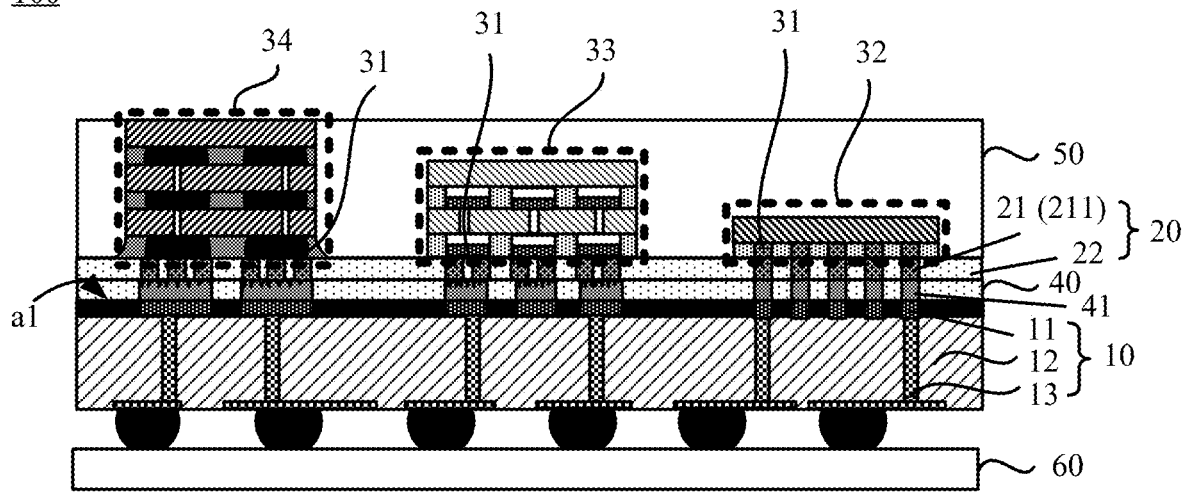
FIG. 9A is a cross-sectional view of still another chip package on package structure according to an embodiment of this application.

In some embodiments, as shown in FIG. 9A (a cross-sectional view of the chip package on package structure 100), the chip package on package structure 100 further includes a substrate 60. The substrate 60 is located on a side that is of the primary chip stack unit 10 and that is away from the first bonding layer 20, and the first through silicon via 13 of the primary chip stack unit 10 is bonded to the substrate 60.

In other words, in this embodiment, the secondary chip stack unit 20, the primary chip stack unit 10, and the substrate 60 are packaged by using an embedded package (embedded die in substrate package) technology. The first through silicon via 13 is directly formed in the primary die 12 to implement signal transfer. Therefore, the primary chip stack unit 10 has a small volume, and the chip package on package structure 100 has advantages such as high integration, high heat dissipating performance, and low inductance.

Figure 9B:
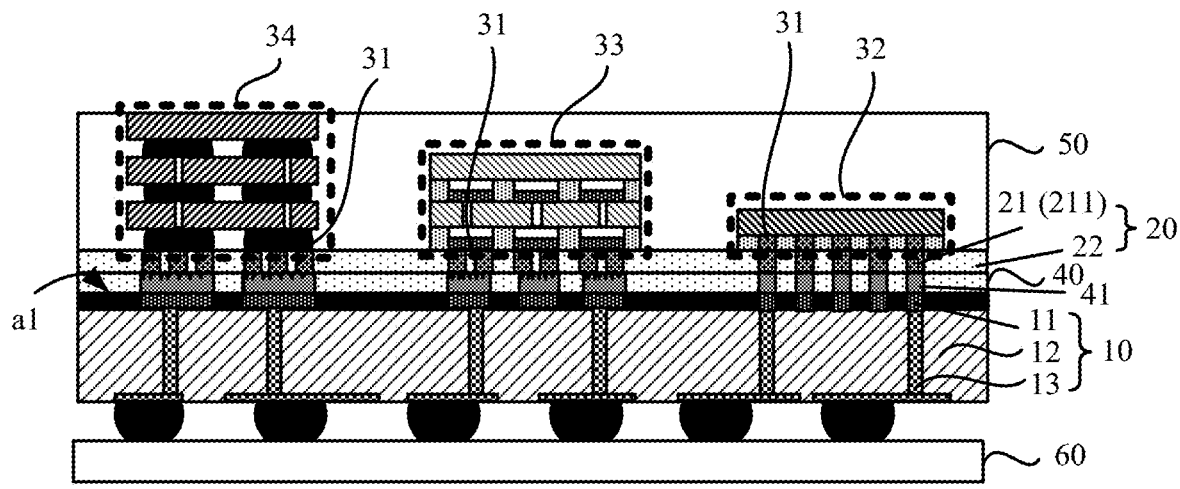
FIG. 9B is a cross-sectional view of still another chip package on package structure according to an embodiment of this application.

In some embodiments, as shown in FIG. 9B (a cross-sectional view of the chip package on package structure 100), a periphery of the micro bump 31 (e.g., a solder ball) of the third secondary chip stack unit 34 may not be filled with underfill adhesive. A gap between adjacent balls is directly filled when the second molding layer 50 is formed.

When the chip package on package structure 100 shown in FIG. 9A or FIG. 9B needs to be bonded to the PCB, a side that is of the substrate 60 and that is away from the primary chip stack unit 10 is bonded to the PCB by using a solder ball.

Embodiment 2

A difference between the embodiment 2 and the embodiment 1 lies in a structure of a primary chip stack unit 10.

Figure 10A:
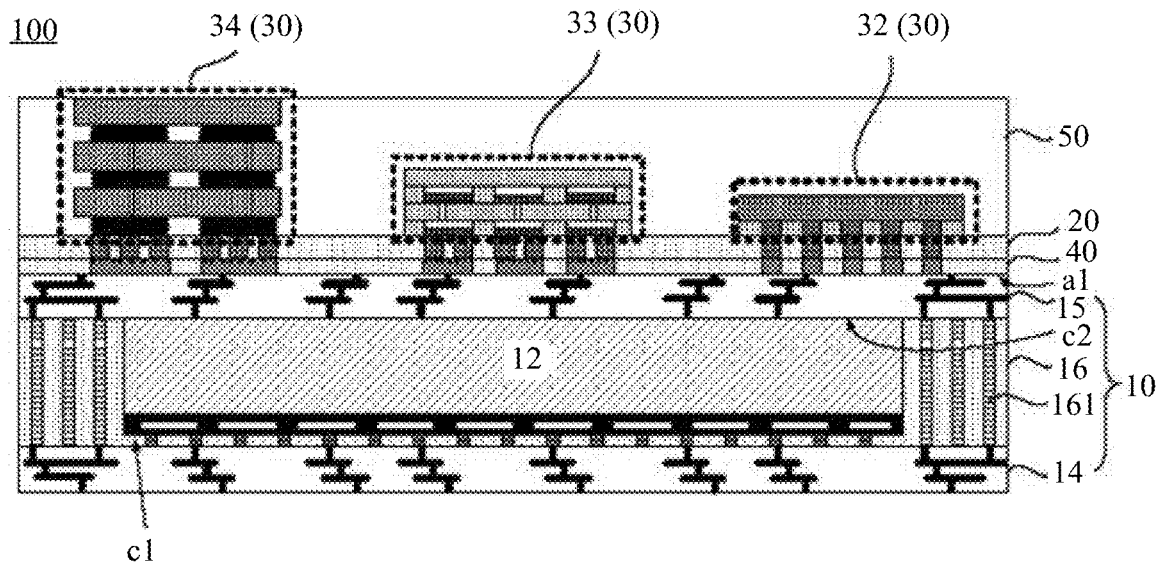
FIG. 10A is a cross-sectional view of still another chip package on package structure according to an embodiment of this application.

As shown in FIG. 10A (a cross-sectional view of a chip package on package structure 100), the chip package on package structure 100 includes a primary chip stack unit 10, a first bonding layer 20, a plurality of secondary chip stack units 30, a second bonding layer 40, and a second molding layer 50.

The primary chip stack unit includes a primary die 12, a first redistribution layer 14, a second redistribution layer 15, and a first molding layer 16.

The first redistribution layer 14 is disposed on an active surface c1 of the primary die 12 and bonded to the primary die 12.

The second redistribution layer 15 is disposed on a non-active surface c2 of the primary die 12, and a surface that is of the second redistribution layer 15 and that is away from the primary die 12 is used as the first surface a1.

The surface that is of the second redistribution layer 15 and that is away from the primary die 12 is used as the first surface a1. In this case, the surface that is of the second redistribution layer 15 and that is away from the primary die 12 has a primary pin 11.

The plurality of secondary chip stack units 30 include a first secondary chip stack unit 32, a second secondary chip stack unit 33, and a third secondary chip stack unit 34. Active surfaces of the first secondary chip stack unit 32, the second secondary chip stack unit 33, and the third secondary chip stack unit 34 face the primary chip stack unit 10. The active surface c1 of the primary chip stack unit 10 faces away from the first secondary chip stack unit 32, and the non-active surface c2 of the primary chip stack unit 10 faces the first secondary chip stack unit 32. Therefore, the first secondary chip stack unit 32, the second secondary chip stack unit 33, and the third secondary chip stack unit 34 are electrically interconnected with the primary chip stack unit 10 through active surface-to-non-active surface (e.g., face to back (F2B)).

The first molding layer 16 is disposed between the first redistribution layer 14 and the second redistribution layer 15, and is located on a periphery of the primary die 12. The first molding layer 16 has a plurality of first through molding vias 161 passing through the first molding layer 16, and two ends of the first through molding via 161 are bonded to the first redistribution layer 14 and the second redistribution layer 15 respectively.

A material of the first molding layer 16 may be, for example, a molding material or an insulation material.

In other words, a first through silicon via 13 is not disposed inside the primary chip stack unit 10, the first through molding via 161 is disposed on the periphery of the primary chip stack unit 10, and the first molding layer 16 protects the primary chip stack unit 10 and the first through molding via 161.

Structures of the first bonding layer 20, the plurality of secondary chip stack units 30, the second bonding layer 40, and the second molding layer 50 in the embodiment 2 may be the same as those in the embodiment 1. Refer to related descriptions in the embodiment 1. Details are not described in the embodiment 2.

It should be noted that, as shown in FIG. 10A, the first secondary chip stack unit 32, the second secondary chip stack unit 33, and the third secondary chip stack unit 34 may be located directly above the first through molding via 161, and are not limited to being located directly above the primary chip stack unit 10.

In other words, the secondary chip stack unit 20, the primary chip stack unit 10, and a substrate 60 are packaged by using a fan-out wafer level package (FOWLP) technology in this embodiment. The fan-out package can increase a quantity of output pins and adjust locations of the output pins by redistributing and leading out a signal, and has a wide application scope.

When the chip package on package structure 100 shown in FIG. 10A needs to be bonded to a PCB, the PCB is located on a side that is of the first redistribution layer 14 and that is away from the first bonding layer 20, and the first redistribution layer 14 is bonded to the PCB.

Figure 10B:
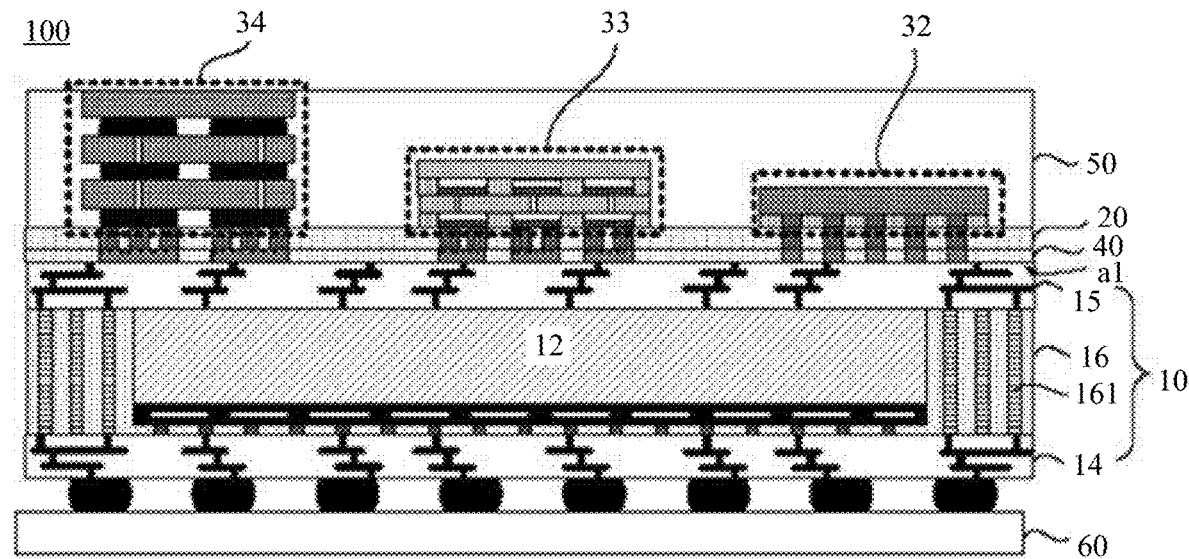
FIG. 10B is a cross-sectional view of still another chip package on package structure according to an embodiment of this application.

As shown in FIG. 10B (a cross-sectional view of the chip package on package structure 100), the chip package on package structure 100 further includes the substrate 60, and the substrate 60 is located on a side that is of the first redistribution layer 14 and that is away from the primary chip stack unit 10. The first redistribution layer 14 is bonded to the substrate 60.

When the chip package on package structure 100 shown in FIG. 10B needs to be bonded to the PCB, the substrate 60 is bonded to the PCB.

The following describes a packaging process of the primary chip stack unit 10 shown in FIG. 10B.

Figure 11A:
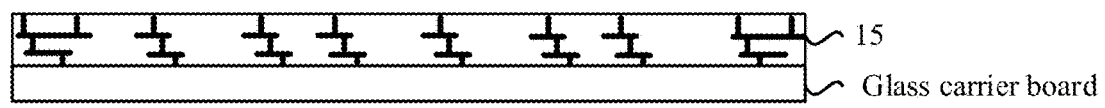
FIG. 11A to FIG. 11F are schematic diagrams of a packaging process of a primary chip stack unit according to an embodiment of this application.

As shown in FIG. 11A, first, the second redistribution layer 15 is formed on a glass carrier board.

Figure 11B:
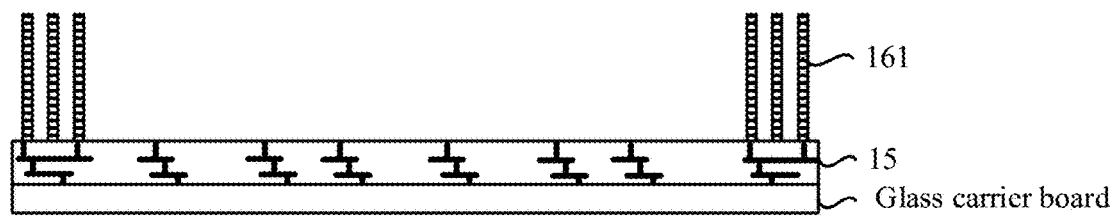

As shown in FIG. 11B, the first through molding via 161 is formed through electroplating on the second redistribution layer 15.

Figure 11C:
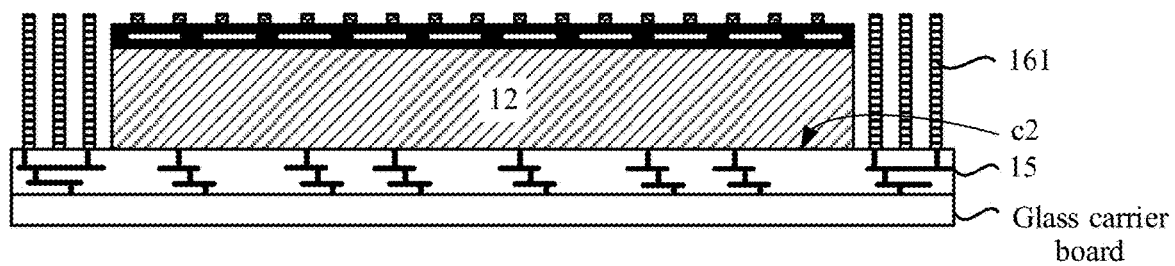

As shown in FIG. 11C, the non-active surface c2 of the primary die 12 faces the second redistribution layer 15, and the primary die 12 is bonded to the second redistribution layer 15.

Figure 11D:
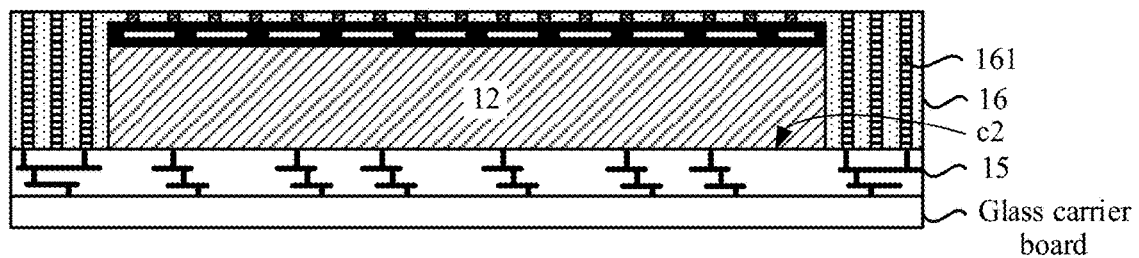

As shown in FIG. 11D, the periphery of the primary die 12 is filled with a molding material to form the first molding layer 16. The first molding layer 16 wraps the primary die 12 and the first through molding via 161, and exposes the first through molding via 161.

Figure 11E:
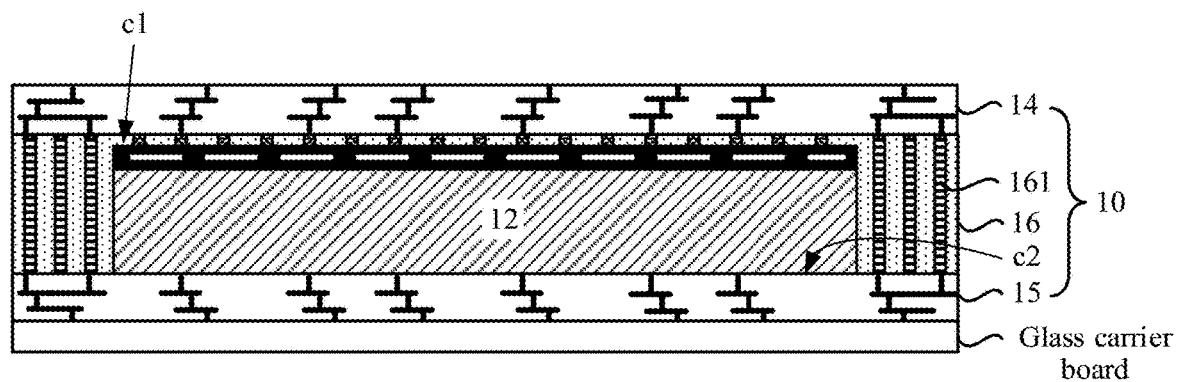

As shown in FIG. 11E, the first redistribution layer 14 is formed on the first molding layer 16. In other words, the first redistribution layer 14 is formed on the active surface c1 of the primary die 12.

Figure 11F:
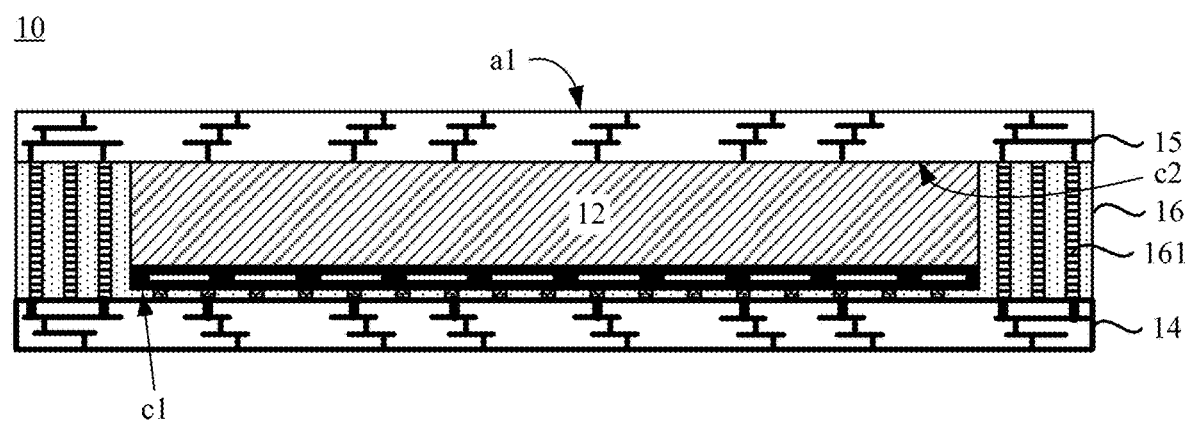

As shown in FIG. 11F, the glass carrier board is removed to form the primary chip stack unit 10.

For a bonding process of the primary chip stack unit 10 and the plurality of secondary chip stack units 30, refer to the foregoing related descriptions.

Embodiment 3

A chip package on package structure 100 in this embodiment is an inverted multi-chip integrated structure.

Figure 12A:
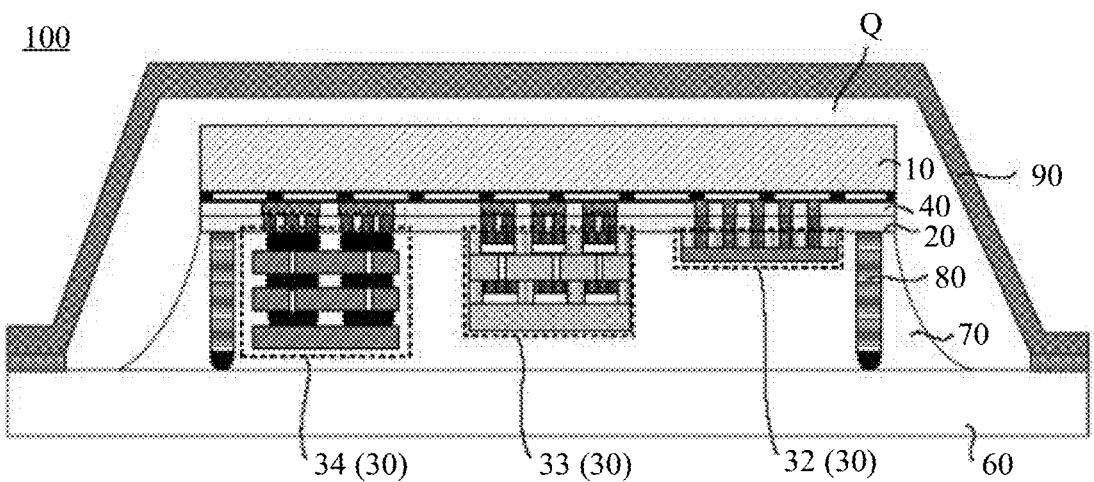
FIG. 12A is a cross-sectional view of still another chip package on package structure according to an embodiment of this application.

As shown in FIG. 12A (a cross-sectional view of the chip package on package structure 100), the chip package on package structure 100 includes a primary chip stack unit 10, a first bonding layer 20, a plurality of secondary chip stack units 30, a second bonding layer 40, a substrate 60, an underfill layer 70, a plurality of through dielectric vias (TDVs) 80, and a heat dissipating lid 90.

The primary chip stack unit 10 includes a primary die 12. An active surface of the primary die 12 is used as a first surface a1.

Structures of the first bonding layer 20, the plurality of secondary chip stack units 30, and the second bonding layer 40 in the embodiment 3 may be the same as those in the embodiment 1. Refer to related descriptions in the embodiment 1. Details are not described in this embodiment.

An active surface of the primary chip stack unit 10 faces an active surface of the secondary chip stack unit 30. The plurality of secondary chip stack units 30 are electrically interconnected with the primary chip stack unit 10 through active surface-to-active surface (face to face, F2F).

The underfill layer 70 is located between the primary chip stack unit 10 and the substrate 60, and covers the plurality of secondary chip stack units 30.

A gap between the primary chip stack unit 10 and the substrate 60 may be filled in a filling manner, for example, capillary underfill (CUF), molded underfill (MUF), non-conductive film (NCF) filling, or non-conductive paste (NCP) filling, to form the underfill layer 70.

Because a strength of a molding material is high, in some embodiments, a molding underfill process is used to fill the molding material between the primary chip stack unit 10 and the substrate 60, to form the underfill layer 70.

The through dielectric via 80 of the plurality of through dielectric vias 80 is embedded in the underfill layer 70, and two ends of the through dielectric via 80 are bonded to the substrate 60 and at least one bonding part 211 of a bonding component 21 respectively.

The through dielectric via 80 may be, for example, a copper stud. In this case, the through dielectric via 80 may be bonded to the substrate 60 through a solder ball. The through dielectric via 80 may alternatively be a solder ball or the like.

The heat dissipating lid 90 has a groove. The heat dissipating lid 90 and the substrate 60 are jointed, and the groove and the substrate 60 form a receptacle Q. The primary chip stack unit 10 and the plurality of secondary chip stack units 30 are located in the receptacle Q.

Figure 12B:
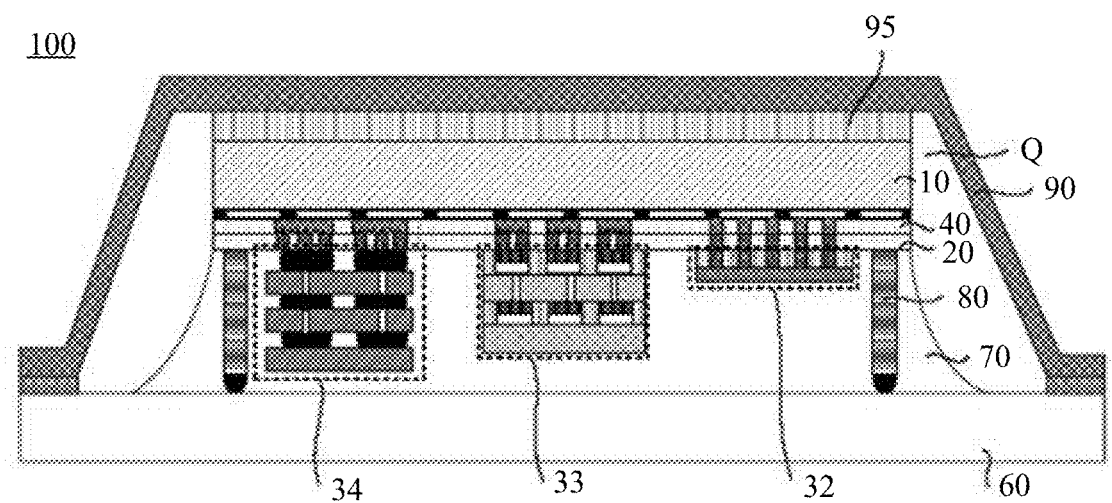
FIG. 12B is a cross-sectional view of still another chip package on package structure according to an embodiment of this application.

In some embodiments, as shown in FIG. 12B (a cross-sectional view of the chip package on package structure 100), the chip package on package structure 100 further includes a thermally conductive adhesive 95, to improve a heat dissipating effect of the primary chip stack unit 10. The thermally conductive adhesive 95 is located between the primary chip stack unit 10 and the heat dissipating lid 90, and is configured to bond the primary chip stack unit 10 and the heat dissipating lid 90.

Heat on the primary chip stack unit 10 may be directly exported through the heat dissipating lid 90 by bonding the primary chip stack unit 10 to the heat dissipating lid 90, to improve a heat dissipating effect of the primary chip stack unit 10.

When the chip package on package structure 100 needs to be bonded to a PCB, the substrate 60 is bonded to the PCB through a solder ball.

The following describes a packaging method of the chip package on package structure 100 shown in FIG. 12B.

First, the second bonding layer 40 is formed on the primary chip stack unit 10.

The first bonding layer 20 is formed on the second bonding layer 40.

Figure 13A:
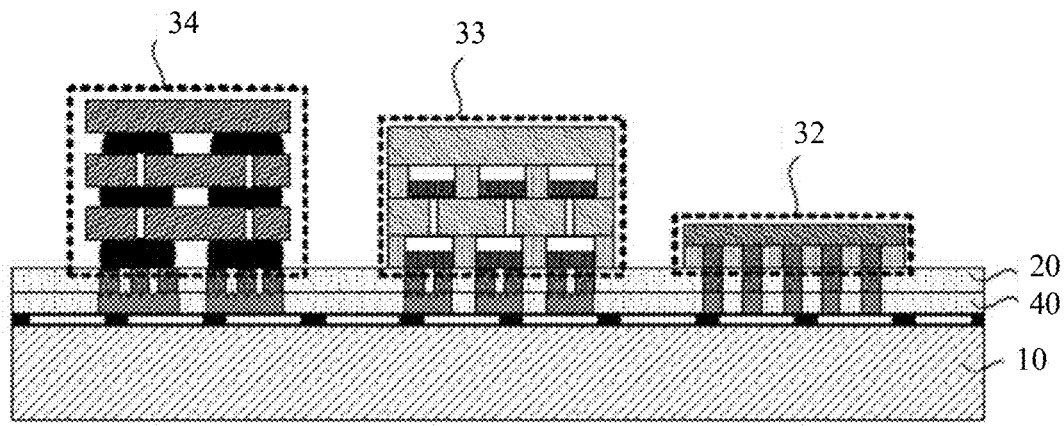
FIG. 13A to FIG. 13E are schematic diagrams of a packaging process of a chip package on package structure according to an embodiment of this application.

A third secondary chip stack unit 34, a first secondary chip stack unit 32, and a second secondary chip stack unit 33 are sequentially bonded to the first bonding layer 20, to form a structure shown in FIG. 13A.

Figure 13B:
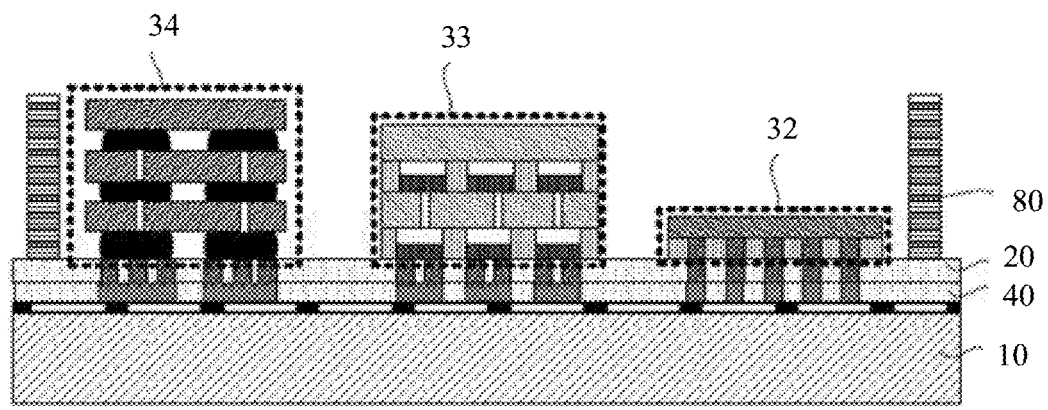

As shown in FIG. 13B, the through dielectric via 80 is formed on a surface that is of the first bonding layer 20 and that is away from the primary chip stack unit 10.

Figure 13C:
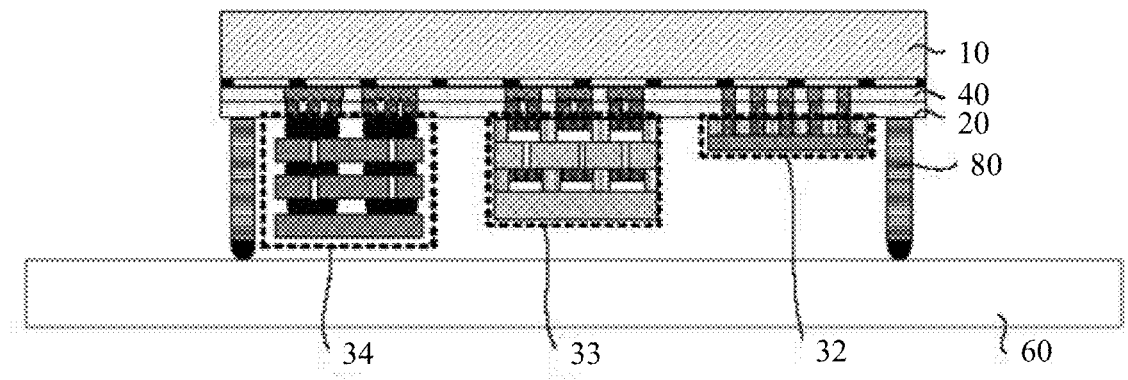

As shown in FIG. 13C, the through dielectric via 80 is bonded to the substrate 60.

Figure 13D:
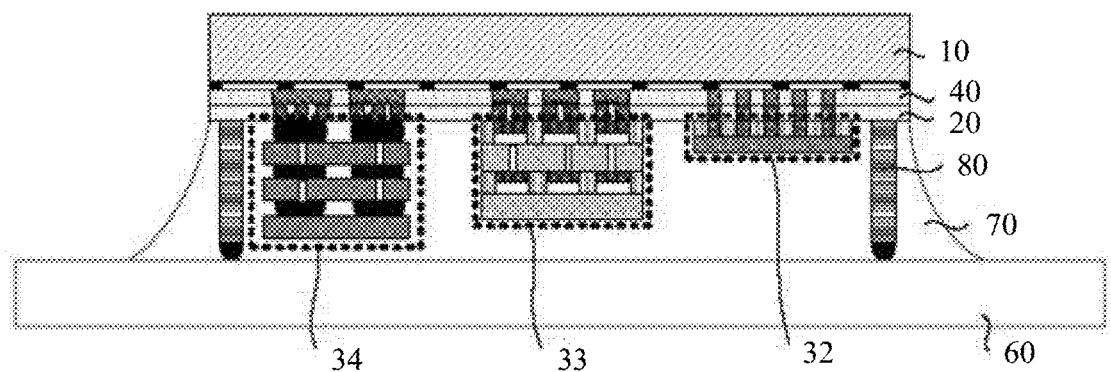

As shown in FIG. 13D, a molding material is filled between the substrate and the first bonding layer 20 to form the underfill layer 70.

Figure 13E:
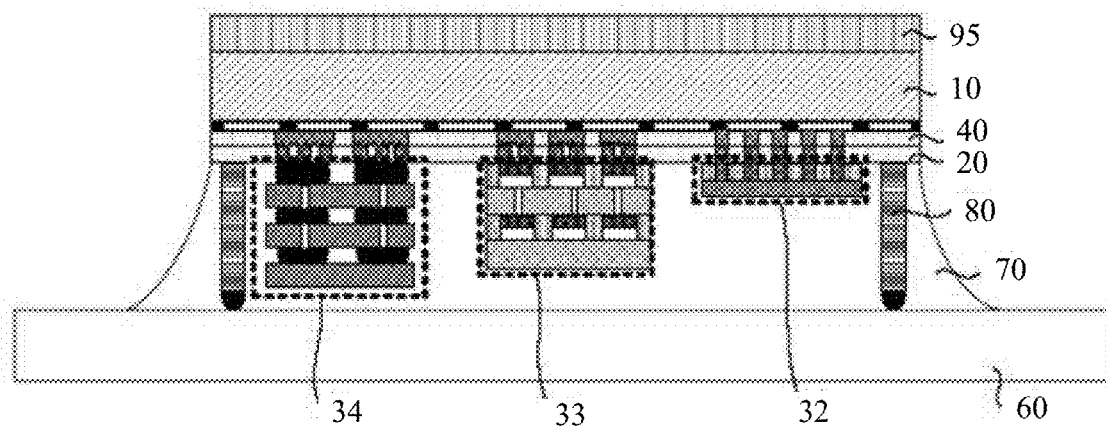

As shown in FIG. 13E, the thermally conductive adhesive 95 bonded to the primary chip stack unit 10 is formed on a side that is of the primary chip stack unit 10 and that is away from the substrate 60.

The heat dissipating lid 90 and the substrate 60 are jointed, and the thermally conductive adhesive 95 and the heat dissipating lid are bonded, to form the chip package on package structure 100 shown in FIG. 12B.

Embodiment 4

A difference between the embodiment 4 and the embodiment 3 lies in a bonding manner of a primary chip stack unit 10 and a substrate 60.

Figure 14:
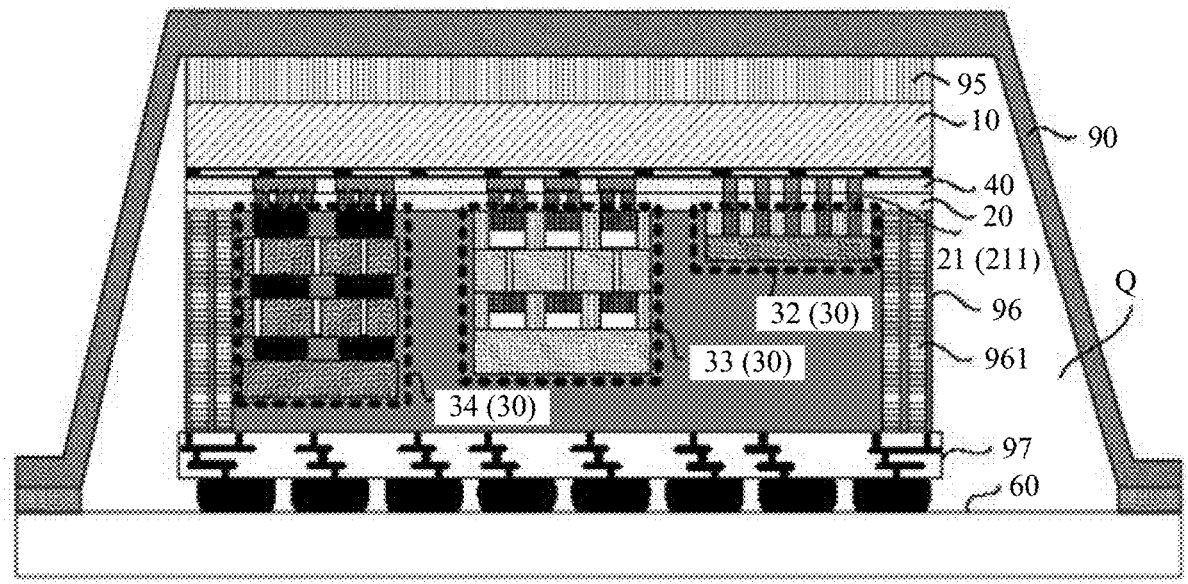
FIG. 14 is a cross-sectional view of still another chip package on package structure according to an embodiment of this application.

As shown in FIG. 14 (a cross-sectional view of a chip package on package structure 100), the chip package on package structure 100 includes a first bonding layer 20, a plurality of secondary chip stack units 30, a second bonding layer 40, a substrate 60, a third molding layer 96, a third redistribution layer 97, and a heat dissipating lid 90 and a thermally conductive adhesive 95.

Structures of a primary chip stack unit 10, the first bonding layer 20, the plurality of secondary chip stack units 30, the second bonding layer 40, the heat dissipating lid 90, and the thermally conductive adhesive 95 in the embodiment 4 may be the same as those in the embodiment 3. Refer to related descriptions in the embodiment 3. Details are not described in this embodiment.

As shown in FIG. 14, the third molding layer 96 covers a first secondary chip stack unit 32, a second secondary chip stack unit 33, and a third secondary chip stack unit 34. The third molding layer 96 has a plurality of second through molding vias 961 passing through the third molding layer 96, and a first end of the second through molding via 961 is bonded to at least one bonding part 211 in one bonding part 21.

The third redistribution layer 97 is disposed on a side that is of the third molding layer 96 and that is away from the primary chip stack unit 10. The third redistribution layer 97 is bonded to a second end of the second through molding via 961.

The substrate 60 is disposed on a side that is of the third redistribution layer 97 and that is away from the primary chip stack unit 10, and bonded to the third redistribution layer 97.

The following describes a packaging method of the chip package on package structure 100 shown in FIG. 14.

First, the second bonding layer 40 is formed on the primary chip stack unit 10.

The first bonding layer 20 is formed on the second bonding layer 40.

A third secondary chip stack unit 34, a first secondary chip stack unit 32, and a second secondary chip stack unit 33 are sequentially bonded to the first bonding layer 20, to form a structure shown in FIG. 13A.

Figure 15A:
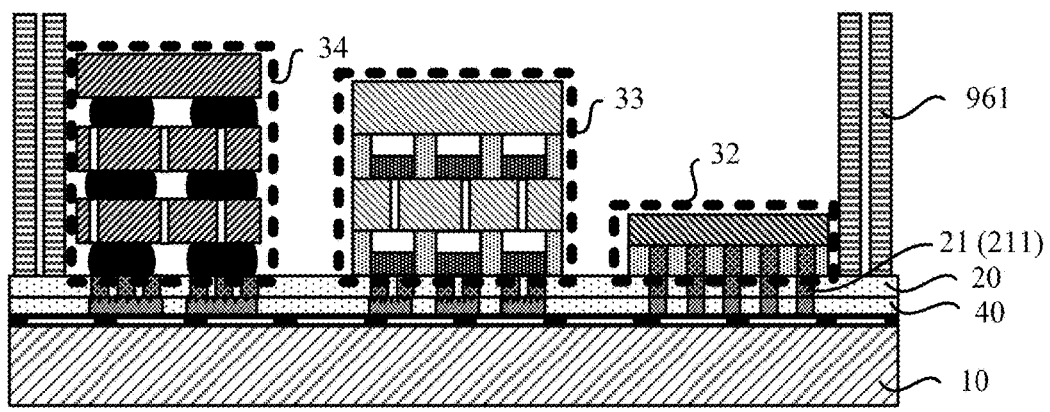
FIG. 15A to FIG. 15E are schematic diagrams of a packaging process of a chip package on package structure according to an embodiment of this application.

As shown in FIG. 15A, the second through molding via 961 is formed on a surface that is of the first bonding layer 20 and that is away from the primary chip stack unit 10.

Figure 15B:
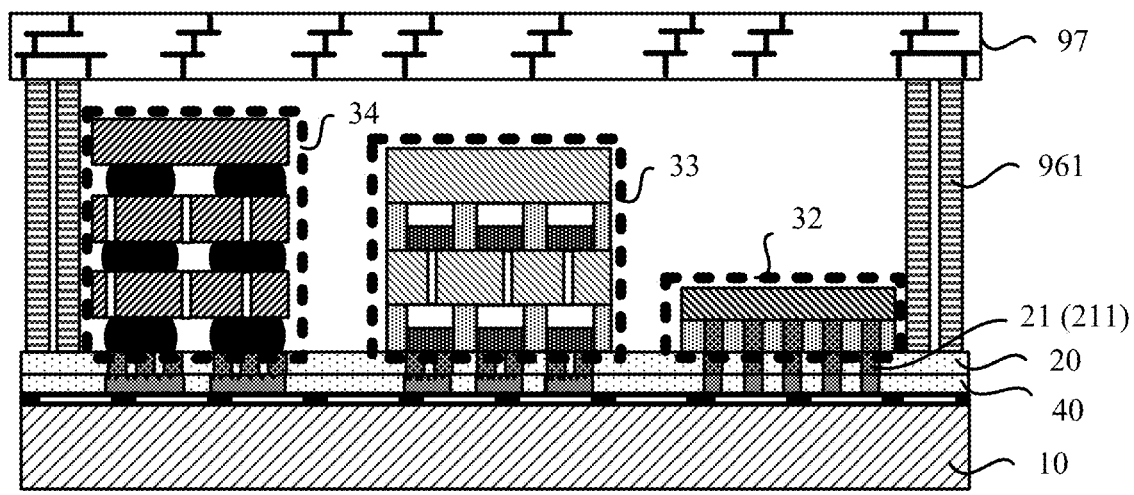

As shown in FIG. 15B, the second through molding via 961 is bonded to the third redistribution layer 97.

Figure 15C:
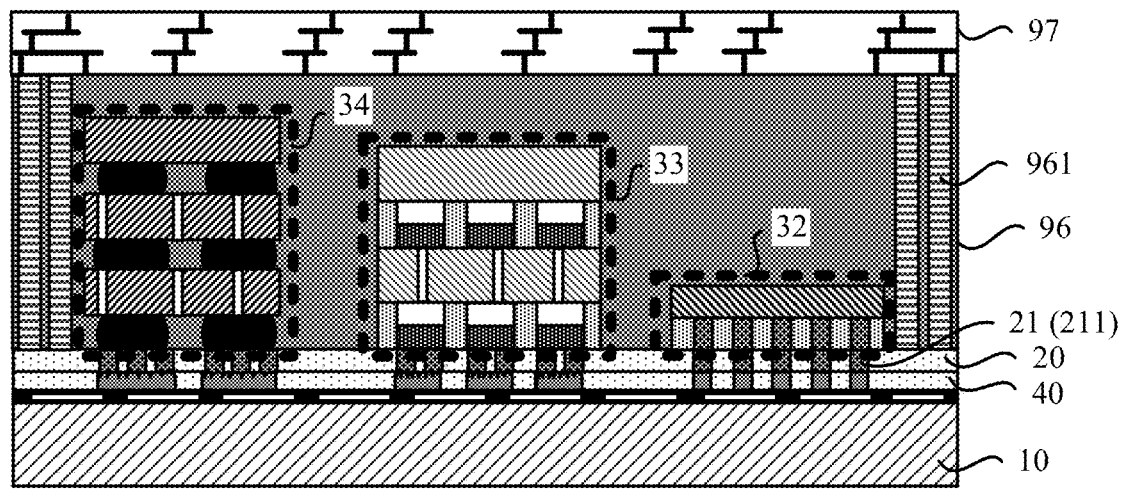

As shown in FIG. 15C, a molding material is filled between the first bonding layer 20 and the third redistribution layer 97 to form the third molding layer 96.

Figure 15D:
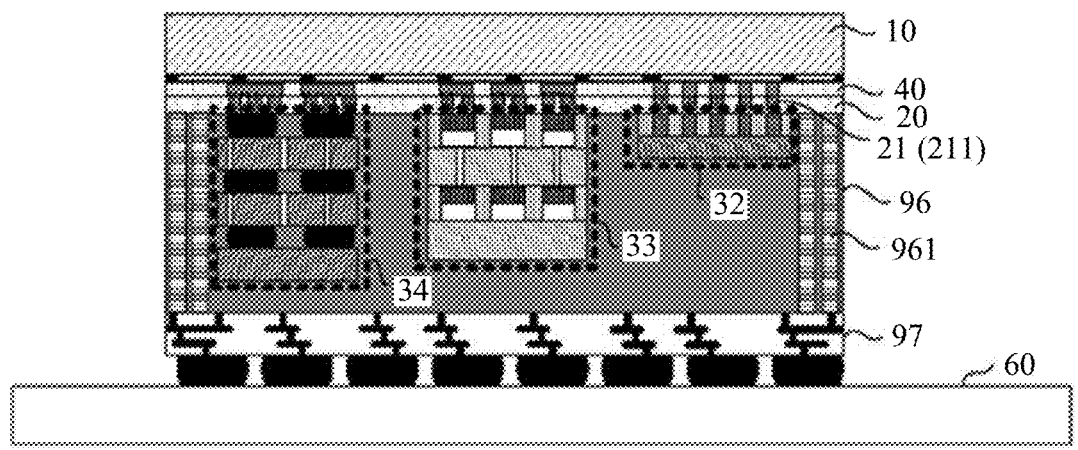

As shown in FIG. 15D, the third redistribution layer 97 is bonded to the substrate 60.

Figure 15E:
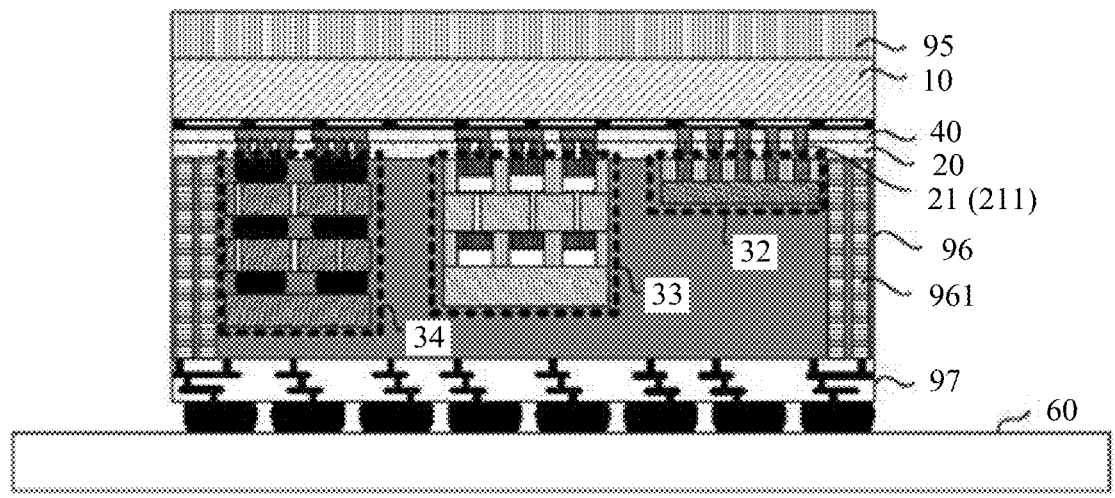

As shown in FIG. 15E, the thermally conductive adhesive 95 is formed on a side that is of the primary chip stack unit 10 and that is away from the substrate 60.

The heat dissipating lid 90 and the substrate 60 are jointed, and the thermally conductive adhesive 95 and the heat dissipating lid are bonded, to form the chip package on package structure 100 shown in FIG. 14.

The foregoing descriptions are merely specific implementations of the present disclosure, but are not intended to limit the protection scope of the present disclosure. Any variation or replacement readily figured out by persons skilled in the art within the technical scope disclosed in the present disclosure shall fall within the protection scope of the present disclosure. Therefore, the protection scope of the present disclosure shall be subject to the protection scope of the claims.

What is claimed is:

1. A chip package on package structure, comprising:
   a first chip comprising:
      a first surface; and
      first pins that are insulated from each other, spaced apart from each other, and disposed on the first surface;
   a first bonding layer disposed on the first surface and comprising:
      a second surface that is away from the first chip; and
      bonding components that comprise a first plurality of bonding parts and that are insulated and spaced apart from each other, wherein each bonding component of the bonding components comprises at least one bonding part of the first plurality of bonding parts, wherein each bonding part of the first plurality of bonding parts is insulated from and has a same first cross-sectional area as each other bonding part of the first plurality of bonding parts, wherein each bonding component of the bonding components is bonded to one or more respective pins of the first pins, and wherein each first pin of the first pins is bonded to at least one respective bonding part of the first plurality of bonding parts;
   second chips that are stacked on the first chip, that are disposed on the second surface, and that comprise a plurality of micro bumps insulated and spaced from each other, wherein each micro bump of the plurality of micro bumps is bonded to a corresponding bonding component of the bonding components and to at least one corresponding bonding part of the first plurality of bonding parts of the corresponding bonding component;
   a substrate;
   an underfill layer located between the first chip and the substrate and covering the second chips; and
   a plurality of through dielectric vias embedded in the underfill layer, wherein two ends of each via of the plurality of through dielectric vias are respectively bonded to the substrate and a respective bonding component of the bonding components.

2. The chip package on package structure of claim 1, wherein the at least one bonding part of each bonding component of the bonding components comprises a respective second plurality of bonding parts of the first plurality of bonding parts, and wherein spacings between adjacent bonding parts in the respective second plurality of bonding parts are equal.

3. The chip package on package structure of claim 1, wherein each chip of the second chips comprises respective micro bumps of the plurality of micro bumps, wherein respective micro bumps of different chips of the second chips have different cross-sectional areas, wherein a first micro bump of the plurality of micro bumps has a smallest cross-sectional area, and wherein a second cross-sectional area of each bonding part of the first plurality of bonding parts is equal to the smallest cross-sectional area.

4. The chip package on package structure of claim 3, wherein a third chip of the second chips comprises a first bonding component of the bonding components and one or more micro bumps of the plurality of micro bumps that have the smallest cross-sectional area, and wherein a first spacing between the one or more micro bumps is equal to a second spacing between adjacent bonding parts of the bonding parts in the first bonding component.

5. The chip package on package structure of claim 1, further comprising a second bonding layer that is disposed between the first chip and the first bonding layer and that comprises a plurality of auxiliary pins insulated and spaced from each other, wherein a first end of each auxiliary pin of the plurality of auxiliary pins is bonded to a respective pin of the first pins and a second end of each auxiliary pin of the plurality of auxiliary pins is bonded to a respective bonding component of the bonding components, and wherein each auxiliary pin of the plurality of auxiliary pins is bonded to at least one respective bonding part of the first plurality of bonding parts.

6. The chip package on package structure of claim 5, wherein each auxiliary pin of the plurality of auxiliary pins that is bonded to a same bonding component of the bonding components as a corresponding micro bump of the plurality of micro bumps has a same second cross-sectional area as the corresponding micro bump.

7. The chip package on package structure of claim 1, wherein for each bonding component of the bonding components, a quantity of second bonding parts of the first plurality of bonding parts of a first bonding component of the bonding components that is bonded to a first micro bump of the plurality of micro bumps that has a second cross-sectional area is greater than a quantity of third bonding parts of the first plurality of bonding parts of a second bonding component of the bonding components that is bonded to a second micro bump of the plurality of micro bumps that has a third cross-sectional area, and wherein the second cross-sectional area is greater than the third cross-sectional area.

8. The chip package on package structure of claim 1, wherein the first chip comprises a first die, wherein the chip package on package structure further comprises a plurality of first through silicon vias passing through the first die, wherein an active surface of the first die is used as the first surface, and wherein the plurality of first through silicon vias are bonded to the first pins.

9. The chip package on package structure of claim 1, wherein the first chip comprises:
   a first die comprising an active surface and a non-active surface;
   a first redistribution layer disposed on the active surface and bonded to the first die;
   a second redistribution layer disposed on the non-active surface and comprising a redistribution layer surface that is away from the first die; and
   a first molding layer disposed between the first redistribution layer and the second redistribution layer, located on a periphery of the first die, and comprising a plurality of first through molding vias passing through the first molding layer, wherein two ends of each via of the plurality of first through molding vias are respectively bonded to the first redistribution layer and the second redistribution layer.

10. The chip package on package structure of claim 1, wherein the second chips comprise:
    a third chip having a first size and comprising a third surface; and
    a fourth chip having a second size that is less than the first size,
    wherein the chip package on package structure further comprises a molding layer that covers all of the second chips on a side away from the first chip and that comprises a fourth surface that is away from the third chip, and
    wherein in a direction perpendicular to the first chip, the third surface is aligned with the fourth surface.

11. The chip package on package structure of claim 1, further comprising:
    a molding layer covering the second chips and comprising a first side that is away from the first chip;
    a plurality of through molding vias passing through the molding layer and comprising first ends and second ends, wherein each of the first ends is bonded to a respective bonding part of the bonding parts; and
    a redistribution layer that comprises a second side that is away from the first chip, that is disposed on the first side, and that is bonded to the second ends, wherein substrate is disposed on the second side and bonded to the redistribution layer.

12. The chip package on package structure of claim 1, wherein the first chip comprises a first die comprising an active surface that corresponds to the first surface, and wherein the chip package on package structure further comprises:
    a heat dissipating lid comprising a groove and coupled to the substrate, wherein the groove and the substrate form a receptacle in which the first chip and the second chips are located; and
    a thermally conductive adhesive located between the first chip and the heat dissipating lid and configured to bond the first chip and the heat dissipating lid.

13. The chip package on package structure of claim 1, wherein each of the second chips comprises a plurality of stacked dies comprising a first die that is closest to the first bonding layer and bonded to the first bonding layer, and wherein adjacent dies of the stacked dies are bonded to each other.

14. An electronic device, comprising:
    a circuit board; and
    a chip package on package structure bonded to the circuit board and comprising:
        a first chip comprising:
            a first surface; and
            first pins that are on the first surface and that are insulated and spaced from each other;
        a first bonding layer disposed on the first surface and comprising:
            a second surface that is away from the first chip; and
            bonding components that comprise a first plurality of bonding parts and that are insulated and spaced from each other, wherein each bonding component of the bonding components comprises at least one bonding part of the first plurality of bonding parts, wherein each bonding part of the first plurality of bonding parts is insulated and has a same cross-sectional area as each other bonding part of the first plurality of bonding parts, wherein each bonding component of the bonding components is bonded to one or more respective pins of the first pins, and wherein each pin of the first pins is bonded to at least one respective bonding part of the first plurality of bonding parts;
        second chips that are stacked on the first chip, that are disposed on the second surface, and that comprise a plurality of micro bumps insulated and spaced from each other, wherein each micro bump of the plurality of micro bumps is bonded to a corresponding bonding component of the bonding components and to at least one corresponding bonding part of the first plurality of bonding parts of the corresponding bonding component;
        a substrate;
        an underfill layer located between the first chip and the substrate and covering the second chips; and
        a plurality of through dielectric vias embedded in the underfill layer, wherein two ends of each via of the plurality of through dielectric vias are respectively bonded to the substrate and a respective bonding component of the bonding components.

15. The electronic device of claim 14, wherein the at least one bonding part of each bonding component of the bonding components comprises a respective second plurality of bonding parts of the first plurality of bonding parts, and wherein spacings between adjacent bonding parts in the respective second plurality of bonding parts are equal.

16. The electronic device of claim 14, wherein the at least one bonding part of each bonding component of the bonding components comprises a respective second plurality of bonding parts of the first plurality of bonding parts, and wherein spacings between adjacent bonding parts in the respective second plurality of bonding parts are equal.

17. The electronic device of claim 14, wherein each chip of the second chips comprises respective micro bumps of the plurality of micro bumps, wherein respective micro bumps of different chips of the second chips have different cross-sectional areas, wherein a first micro bump of the plurality of micro bumps has a smallest cross-sectional area, and wherein a second cross-sectional area of each bonding part of the first plurality of bonding parts is equal to the smallest cross-sectional area.

18. The electronic device of claim 17, wherein a third chip of the second chips comprises a first bonding component of the bonding components and one or more micro bumps of the plurality of micro bumps that have the smallest cross-sectional area, and wherein a first spacing between the one or more micro bumps is equal to a second spacing between adjacent bonding parts of the bonding parts in the first bonding component.

19. The electronic device of claim 14, wherein the first chip comprises a first die, wherein the chip package on package structure further comprises a plurality of first through silicon vias passing through the first die, wherein an active surface of the first die is used as the first surface, and wherein the plurality of first through silicon vias are bonded to the first pins.

20. The electronic device of claim 14, wherein each of the second chips comprises a plurality of stacked dies comprising a first die that is closest to the first bonding layer and bonded to the first bonding layer, and wherein adjacent dies of the stacked dies are bonded to each other.

* * * * *